United States Patent
Yoshida et al.

(10) Patent No.: US 6,946,239 B2
(45) Date of Patent: Sep. 20, 2005

(54) METHOD OF DEVELOPING PHOTOSENSITIVE PLANOGRAPHIC PRINTING PLATE

(75) Inventors: Susumu Yoshida, Shizuoka-ken (JP); Akinori Kimura, Kanagawa (JP); Toshihiro Suya, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/254,576

(22) Filed: Sep. 26, 2002

(65) Prior Publication Data

US 2003/0104317 A1 Jun. 5, 2003

(30) Foreign Application Priority Data

Sep. 28, 2001 (JP) ........................................ 2001-303987

(51) Int. Cl.[7] .............................. G03F 7/30; G03F 7/32
(52) U.S. Cl. ...................... 430/325; 430/326; 430/331
(58) Field of Search ................................ 430/325, 326, 430/331

(56) References Cited

U.S. PATENT DOCUMENTS 6,083,664 A * 7/2000 Inno et al. .................. 430/302
6,165,690 A * 12/2000 Yoshida et al. ............. 430/302
6,547,461 B1 * 4/2003 Matsuda et al. ............ 396/614
2002/0055066 A1   5/2002 Takamiya

FOREIGN PATENT DOCUMENTS

| EP | 1 014 200 A1 | 6/2000 |
| EP | 1 061 418 A2 | 12/2000 |
| EP | 1 061 418 | * 12/2000 |
| EP | 1 091 253 A2 | 4/2001 |
| JP | 11-119419 | 4/1999 |

* cited by examiner

*Primary Examiner*—Hoa Van Le
(74) *Attorney, Agent, or Firm*—Sughrue Mion, PLLC

(57) ABSTRACT

A method of developing a photosensitive planographic printing plate which includes a support and a recording layer and which has been exposed to a light beam with a developer, wherein the photosensitive planographic printing plate is immersed in the developer while being conveyed, and development is accelerated by brushing the immersed photosensitive planographic printing plate with a brush member produced by winding, around a peripheral surface of an axially rotating roller, a brushing band composed of a sheet-like substrate containing a hairy material woven therein.

10 Claims, 8 Drawing Sheets

METHOD OF DEVELOPING PHOTOSENSITIVE PLANOGRAPHIC PRINTING PLATE

BACKGROUND OF THE INVENTION

1. Field of the Invention

The present invention relates to a method of developing a photosensitive planographic printing plate which comprises a hydrophilic support and a photosensitive layer formed by applying to the hydrophilic support a positive photosensitive composition for an infrared laser and which has been exposed to an infrared light beam with an alkaline liquid developer containing at least one saccharide selected from non-reducing sugars and at least one base.

2. Description of the Related Art

Automatic developing machines for printing plates are being widely used in recent years in the plate-making and printing industries in order to rationalize and standardize plate-making operations. Such automatic developing machines generally comprise a development section and a post-treatment section, and include apparatus for conveying a printing plate, various processing liquid tanks and spray apparatus. After the printing plate has been exposed, the printing plate is developed using spray nozzles to spray the printing plate with the various processing liquids, which are pumped by a pump while the printing plate is conveyed horizontally. There is recently also known a method in which a printing plate is processed by immersing the printing plate in processing liquid tanks filled with processing liquids and conveying the printing plate therethrough with immersed guide rolls and the like. In such automatic processing, processing can be conducted while replenishing each processing liquid with replenishers in response to processing amount, operating time and the like.

A disposable processing method can also be applied, in which the printing plate is processed with substantially unused processing liquids.

Conventionally, when the image recording layer of the printing plate is developed, unnecessary portions of the recording layer are removed in the liquid developer liquid by brushing.

For example, when a thermal positive photosensitive planographic printing plate is used, the recording layer is irradiated with an infrared laser beam (light beam) on the basis of image data, whereby an infrared absorbent absorbs this light and generates heat. Thereafter, the plate is immersed in an alkali developer. Exposed portions are soluble in the alkali developer, and the recording layer containing the exposed portions is brushed with the brush roller to remove the exposed portions, whereby an image can be formed.

Channel brush rollers have conventionally been widely used as the brush roller, but they have a disadvantage in that brushing unevenness tends to occur. In order to prevent such brushing unevenness, it is necessary to increase the diameter of the roller.

There is also an apparatus in which a molten brush roller is used as a brush roller, instead of the channel brush roller. Because molten brush rollers are made of a material like fluffy cloth, they have advantages in that there is no rubbing unevenness and they are inexpensive in comparison with channel brush rollers.

However, molten brush rollers are not durable and must be replaced every 1 to 3 months under conditions of ordinary use. There are thus problems in that durability is 1/10–19 in comparison with channel brush rollers, and maintenance is poor.

In the case of a thermal positive photosensitive planographic printing plate, use of a molten brush roller makes it difficult to control pressure. The reason for this is that heat is predicted to transfer to an aluminum support because exposure is basically conducted using heat, and solubility with respect to a developer is set at a higher level.

However, when pressure is high at the time of brushing, it becomes easy for the recording layer itself to be scratched. Since controlling the pressure of a molten brush roller can only be done roughly, suitable pressure cannot be maintained.

Moreover, when a conventional silicate developer is used, deposits are easily formed. The deposit adheres to the brush roller and scratches the plate surface in some cases. Scratches resulting from such deposits become remarkable in the case of a thermal positive photosensitive planographic printing plate.

SUMMARY OF THE INVENTION

An object of the present invention is to obtain a method of developing a photosensitive planographic printing plate which method can set optimal solubility of a developer and optimal brushing pressure, and can solve factors which cause deterioration of image quality such as scratch on the plate surface and the like when a thermal positive printing plate is used which requires severe pressure control at the time of brushing.

The invention provides a method of developing a photosensitive planographic printing plate which has been is exposed to an infrared light beam with an alkaline developer containing at least one saccharide selected from non-reducing sugars and at least one base, the photosensitive planographic printing plate including a hydrophilic support having disposed thereon a recording layer formed by applying to the hydrophilic support a positive photosensitive composition for an infrared laser, the positive photosensitive composition including; (A) at least one alkali aqueous solution-soluble polymer compound having at least one functional group selected from (a-1) a phenolic hydroxyl group, (a-2) a sulfoneamide group, and (a-3) an active imide group; (B) a compound that lowers the solubility of the at least one alkali aqueous solution-soluble polymer compound because of its compatibility with the alkali aqueous solution-soluble polymer compound in an alkali aqueous solution, with the solubility-decreasing action being reduced by heat; (C) a compound that generates heat by absorbing light; and (D) a cyclic acid anhydride, wherein the photosensitive planographic printing plate is immersed in the developer while being conveyed, and development is accelerated by brushing the immersed photosensitive planographic printing plate with a brush member produced by winding, around a peripheral surface of an axially rotating roller, a brushing band composed of a sheet-like substrate containing a hairy material woven therein.

The invention has an effect which gives an advantage of a printing plate that low image forming property of an image recording layer including an alkali aqueous solution-soluble polymer compound is improved, that handling position is not restricted and that decrease in developing property after storage is small, an advantage of a developer that precipitation of a binder resin, infrared absorbenet and the like and its adhesion to the plate surface can be suppressed and that development can be conducted stably for a long period of time while liquid conditions of alkali development processing liquid are maintained, and an advantage of a brush member that scratch on a recording layer by brushing can be suppressed, and that development unevenness can be suppressed since brush pressure can be controlled with high precision.

DETAILED DESCRIPTION OF THE PREFERRED EMBODIMENT

Figure 1:
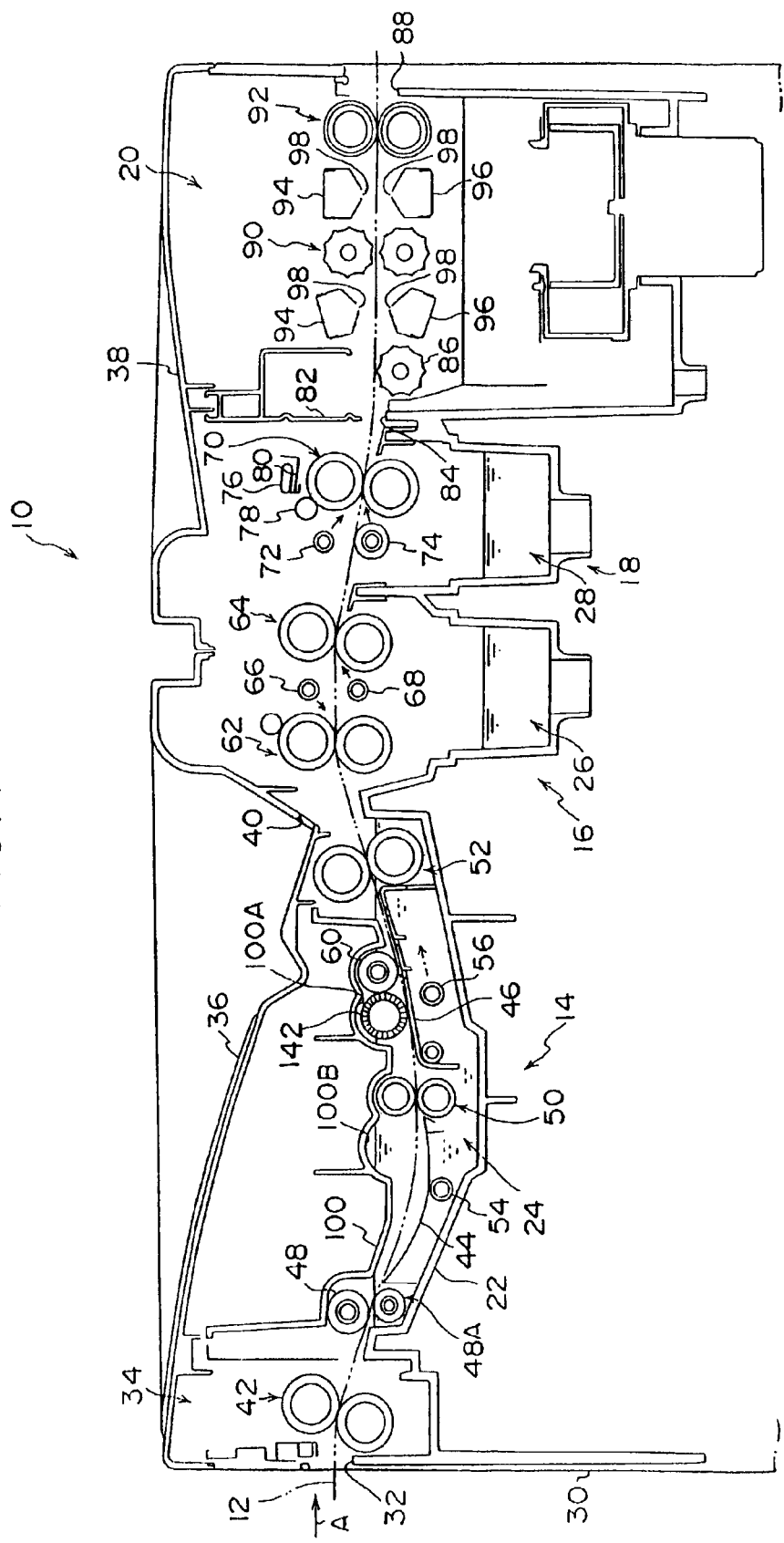
FIG. 1 is a schematic constitutional view of an automatic developing machine according to an embodiment.

In the present invention, (A) an alkali aqueous solution-soluble polymer compound is combined with (B) a compound having in the molecule a group acting mutually with the alkali aqueous solution-soluble polymer compound, and lowers the solubility of the alkali aqueous solution-soluble polymer compound in an alkali aqueous solution because its compatibility with the polymer compound, with the solubility-decreasing action being reduced by heat, and (C) a compound that generates heat by absorbing light. As a result of this combination, the compound (B) which lowers the solubility of the alkali aqueous solution-soluble polymer compound in an alkali aqueous solution because its compatibility with the polymer compound, with the solubility-decreasing action being reduced by heat is compatible uniformly with the alkali aqueous solution-soluble polymer compound (A) to enable formation of a uniform recording layer (coated layer) and to lower solubility of the component (A) in an alkali aqueous solution. However, by exposing this photosensitive layer to an infrared laser beam, the compound (C) that generates heat by absorbing light generates heat at the exposed portions, and the component (A) and the component (B) separate, solution inhibition ability by mutual action of these components is decreased, and in a development process, the exposed porions are easily removed by an alkali aqueous solution which is a developer, to provide excellent image formation, namely, plate-making.

However, such a photosensitive composition shows a phenomenon of decrease in developing property with the lapse of time. The reason for this is believed to as follows. When time lapses after application of the photosensitive composition on a support, the amount of a solvent remaining in the photosensitive layer decreases gradually, and the layer constitution of a film changes accordingly, therefore, developing property decreases.

Further, it is supposed that decrease in developing property due to decrease of a solvent is prevented effectively since (D) a cyclic acid anhydride contained in this applied layer causes, after application, hydrolysis gradually with the lapse of time to form a divalent carboxylic acid, and this decomposition product improves developing property.

In the invention, instead of the compound (B) which lowers the solubility of the polymer compound in an alkali aqueous solution because its compatibility with the polymer compound, with the solubility-decreasing action being reduced by heat, and the compound (C) that generates heat by absorbing light, one compound having properties of both of them can also be contained, and examples of this compound include for example, those of the following general formula (I).

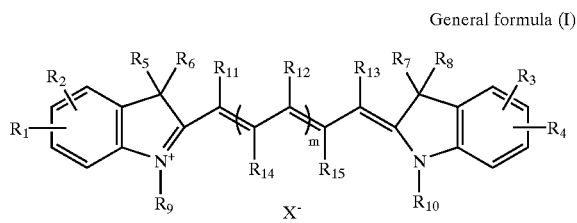

General formula (I)

In the formula, $R_1$ to $R_4$ represent an alkyl group having 1 to 12 carbon atoms, alkenyl group, alkoxy group, cycloalkyl group or aryl group, each optionally having a substituent, and $R_1$ and $R_2$, and $R_3$ and $R_4$ may bond to each other to form a cyclic structure. $R_5$ to $R_{10}$ represent an alkyl group having 1 to 12 carbon atoms optionally having a substituent, and $R_{11}$ to $R_{13}$ represent a hydrogen atom, halogen atom or an alkyl group having 1 to 8 carbon atoms optionally having a substituent, $R_{12}$ may bond to $R_{11}$ or $R_{13}$ to form a ring structure, and when m>2, a plurality of $R_{12}$s may bond to each other to form a ring structure.

$R_{14}$ to $R_{15}$ represent each independently a hydrogen atom, halogen atom or an alkyl group having 1 to 8 carbon atoms optionally having a substituent, $R_{14}$ may bond to $R_{15}$ to form a ring structure, and when m>2, a plurality of $R_{14}$s may bond to each other to form a ring structure.

m represents an integer of 1 to 8. $X^-$ represent an anion.

As the cyclic acid anhydride (D) used in a photosensitive layer of a planographic printing plate precursor used in the method of making a plate of the invention, any compound can be used providing it is an acid anhydride having a cyclic structure such as phthalic anhydride, and specifically, phthalic anhydride, tetrahydrophthalic anhydride, hexahydrophthalic anhydride, 3,6-endooxy-Δ4-tetrahydrophthalic anhydride, tetrachlorophthalic anhydride, maleic anhydride, chloromaleic anhydride, α-phenylmaleic anhydride, succinic anhydride, pyromellitic anhydride and the like described in U.S. Pat. No. 4,115,128 can be preferably used.

The addition amount of the cyclic acid anhydride (D) is preferably from 0.5 to 20% by weight, and more preferably from 1 to 10% by weight. When the addition amount exceeds 20% by weight, sensitivity variation due to hydrolysis of a cyclic acid anhydride becomes too large, and when less than 0.5% by weight, the effect is insufficient.

The alkali aqueous solution-soluble polymer compound (A) used in the invention is a polymer compound having, in the molecule, any of (a-1) phenolic hydroxyl group, (a-2) sulfoneamide group and (a-3) active imide group, and preferably, an alkali aqueous solution-soluble resin having a phenolic hydroxyl group (a-1) (hereinafter, referred to as "resin having a phenolic hydroxyl group"), and a copolymer having at least one of the above-mentioned functional groups (a-1) to (a-3) as a copolymerization component in an amount of 10 mol % or more (hereinafter, referred to as "specific copolymer"), can also be used.

As the polymer compound having a phenolic hydroxyl group (a-1), for example, novolak resins such as a phenol/formaldehyde resin, m-cresol/formaldehyde resin, p-cresol/formaldehyde resin, m-/p-mixed cresol/formaldehyde resin, phenol/cresol (may be any of m-, p-, or m-/p-)/formaldehyde resin and the like, and pyrogallol acetone resins can be used.

These resins having a phenolic hydroxyl group preferably has a weight-average molecular weight of 500 to 2,000, and a number-average molecular weight of 200 to 10,000.

Further, as described in U.S. Pat. No. 4,123,279, a condensate of formaldehyde and phenol having an alkyl group having 3 to 8 carbon atoms as a substituent such as a t-butylphenol/formaldehyde resin, octylphenol/formaldehyde resin may be used together. Such resin having a phenolic hydroxyl group may be used alone or in combination of two or more.

In the case of an alkali aqueous solution-soluble polymer compound having a sulfoneamide group (a-2), examples of the monomer having a sulfoneamide group (a-2) which is a main monomer constituting this polymer compound include monomers composed of a lower molecular weight compound having in one molecule at least one sulfoneamide group in which at least one hydrogen atom bonds to a nitrogen atom and at least one polymerizable unsaturated bond. Among them, preferable are lower molecular weight compounds having an acryloyl group, allyl group, or vinyloxyl group, and a substituted or mono-substituted aminosulfonyl group or substituted sulfonylimino group.

Examples of such compounds include, for example, compounds of the following general formulae (I'), (II) to (V).

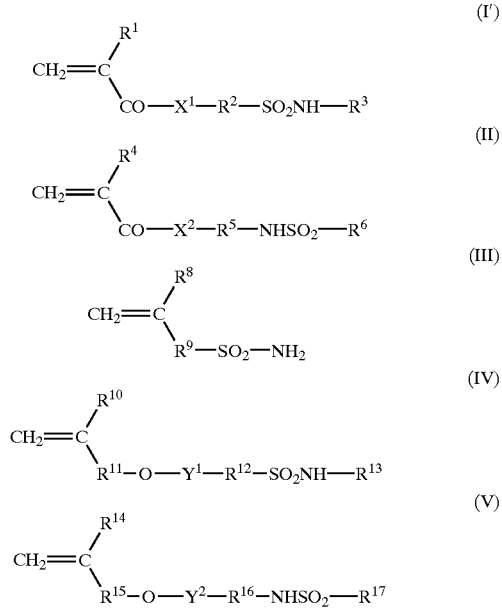

In the formulae, $X^1$ and $X^2$ represent each independently —O— or —$NR^7$—. $R^1$ and $R^4$ represent a hydrogen atom or —$CH_3$. $R^2$, $R^5$, $R^9$, $R^{12}$ and $R^{16}$ represent an alkylene group having 1 to 12 carbon atoms, cycloalkylene group, arylene group or aralkylene group, each optionally having a substituent. $R^3$, $R^7$ and $R^{13}$ represent a hydrogen atom, or an alkyl group having 1 to 12 carbon atoms, cycloalkyl group, aryl group or aralkyl group, each optionally having a substituent. $R^6$, $R^{17}$ represent an alkyl group having 1 to 12 carbon atoms, cycloalkyl group, aryl group or aralkyl group, each optionally having a substituent. $R^8$, $R^{10}$ and $R^{14}$ represent a hydrogen atom or —$CH_3$. $R^{11}$ and $R^{15}$ represent a single bond or an alkylene group having 1 to 12 carbon atoms, cycloalkylene group, arylene group or aralkylene group, each optionally having a substituent. $Y^1$ and $Y^2$ each independently represent a single bond or —CO—.

Specifically, m-aminosulfonylphenyl methacrylate, N-(p-aminosulfonylphenyl)methacrylamide, N-(p-aminosulfonylphenyl)acrylamide and the like can be suitably used.

The alkali aqueous solution-soluble polymer compound having an active imide group (a-3) is a compound having in the molecule an active imide group of the following general formula, and as the monomer having an active imide group (a-3) which is a main monomer constituting this polymer compound, monomers composed of a lower molecular weight compound having in one molecule at least one active imino group of the following formula and at least one polymerizable unsaturated bond can be used.

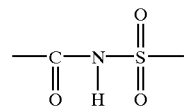

As such compounds, specifically, N-(p-toluenesulfonyl)methacrylamide, N-(p-toluenesulfonyl)acrylamide and the like can be suitably used.

As the alkali aqueous solution-soluble polymer compound (A) of the invention, resins having a phenolic hydroxyl group (a-1), and copolymers containing at least one of the above-mentioned (a-1) to (a-3) as a copolymerization component in an amount of 10 mol % or more can be used as described above, in addition to polymer compounds composed of a monomer, as the main constituent component, containing the above-mentioned functional groups (a-1) to (a-3) and mixtures thereof. This copolymer will be described below.

As the polymer compound having a phenolic hydroxyl group (a-1), for example, a phenol/formaldehyde resin, m-cresol/formaldehyde resin and the like can be used, and it is also possible to copolymerize this polymer compound with another monomer having a phenolic hydroxyl group (a-1), and the monomer having a phenolic hydroxyl group (a-1) as this copolymerization component is a monomer composed of acrylamide, methacrylamide, acrylate, methacrylate or hydroxystyrene, each having a phenolic hydroxyl group.

As such compounds, specifically, N-(4-hydroxyphenyl)acrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene and the like can be preferably used.

Likewise, monomers having the sulfoneamide group (a-2) and monomer having the active imide group (a-3) can be used as a copolymerization component.

The alkali aqueous solution-soluble copolymer which can be used in the invention preferably contains at least one of the above-mentioned groups (a-1) to (a-3) as a copolymerization component in an amount of 10 mol % or more, and those containing them in an amount of 20 mol % or more are more preferable. When the amount of the copolymerization components is less than 10 mol %, mutual action with a resin having a phenolic hydroxyl group becomes insufficient, and an effect of improving development latitude which is an advantage of use of a copolymerization component becomes insufficient.

This copolymer may contain other copolymerization component other than the above-mentioned groups (a-1) to (a-3).

As the other copolymerization component, for example, monomers listed in the following (1) to (12) can be used.

(1) Acrylates and methacrylates having an aliphatic hydroxyl group such as, for example, 2-hydroxyethyl acrylate, 2-hydroxyethyl methacrylate and the like (2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, N-dimethylaminoethyl acrylate and the like (3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, N-dimethylaminoethyl methacrylate and the like (4) Acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide and the like (5) Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether and the like (6) Vinyl esters such as vinyl acetate, vinyl chloroacetate, vinyl butyrate, vinyl benzoate and the like (7) Styrenes such as styrene, α-methylstyrene, methylstyrene, chloromethylstyrene and the like (8) Vinyl ketones such as methyl vinyl ketone, ethyl vinyl ketone, propyl vinyl ketone, phenyl vinyl ketone and the like (9) Olefines such as ethylene, propylene, isobutylene, butadiene, isoprene and the like

(10) N-vinylpyrrolidone, N-vinyl carbazole, 4-vinylpyridone, acrylonitrile, methacrylonitrile and the like

(11) Unsaturated imides such as maleimide, N-acryloylacrylamide, N-acetylmethacrylamide, N-propionylmethacrylamide, N-(p-chlorobenzoyl) methacrylamide and the like

(12) Unsaturated carboxylic acids such as acrylic acid, methacrylic acid, maleic anhydride, itaconic acid and the like In the invention, as the alkali aqueous solution-soluble polymer compound (A), those having a weight-average molecular weight of 2,000 or more and a number-average molecular weight of 500 or more are preferable regardless of whether it is a homopolymer or copolymer. Further preferable are those having a weight-average molecular weight of 5,000 to 300,000 and a number-average molecular weight of 800 to 250,000, and a degree of dispersion (weight-average molecular weight/number-average molecular weight) of 1.1 to 10.

When the above-mentioned resin having a phenolic hydroxyl group (a-1) constitutes a copolymer with the above-mentioned specific copolymerization component, the compounding ratio by weight of these components lies preferably within the range from 50:50 to 5:95, and more preferably within the range from 40:60 to 10:90.

These alkali aqueous solution-soluble polymer compounds (A) may be used alone or in combination of two or more, and used in a addition amount of 30 to 99% by weight, preferably 40 to 95% by weight, and particularly preferably 50 to 90% by weight, based on the total weight of printing plate material solid components. When the addition amount of the alkali-soluble polymer compound is less than 30% by weight, durability of a recording layer deteriorates, and when it exceeds 99% by weight, both of sensitivity and durability decrease.

The compound (B) which lowers the solubility of the polymer compound in an alkali aqueous solution because of its compatibility with the alkali aqueous solution-soluble polymer compound, with the solubility-decreasing action being reduced by heat is a compound which has excellent compatibility with the alkali aqueous solution-soluble polymer compound (A) and can form a uniform mixture and suppresses the alkali aqueous solution-solubility of the component (A) by mutual action with the component (A), a polymer compound, in a recording layer formed by applying a solution in which the compound (B) is mixed uniformly with the component (A). Though this solubility decreasing action of the compound (B) disappears by heating, when the component (B) itself is a compound which is decomposed by heating, if energy sufficient for decomposition is not imparted under conditions such as output of laser, irradiation time and the like, as described above, decrease insolubility suppressing action is insufficient, and there is a possibility of decrease in sensitivity, therefore, the thermal decomposition temperature of the component (B) is preferably 150° C. or more.

As the suitable component (B) used in the invention, compounds mutually acting with the above-mentioned component (A), such as sulfone compounds, ammonium salts, phosphonium salts, amide compounds and the like can be used.

The component (B) should be appropriately selected in consideration of mutual action with the component (A) as described above, and specifically, when a novolak resin is used alone as the component (A), preferably used are cyanine dyes A described later and the like.

The compounding ratio of the component (A) to the component (B) is preferably in the range from 99/1 to 75/25. When the component (B) is less than 99/1, mutual action with the component (A) is insufficient, alkali aqueous solution-solubility cannot be inhibited, and excellent image formation cannot be attained. Further, when the component (B) is more than 75/25, sensitivity decreases remarkably due to excess mutual action. Therefore, both cases are not preferable.

In the invention, the compound (C) that generates heat by absorbing light is a compound having a light absorption region at 700 nm or more, and preferably in an infrared range from 750 to 1200 nm, and manifesting a light/heat exchange ability with light in this wavelength range, and specifically, various pigments or dyes absorbing light in this wavelength range and generating heat can be used.

As the pigment, commercially available pigments and pigments described in Color Index (C.I.) Handbook, "Saishin Ganryo Binran" (edited by Nippon Ganryo Gijutsu Kyokai, 1977), "Saishin Ganryo Oyo Gijutsu" (published by CMC, 1986), "Insatsu Inki Gijutsu" (published by CMC, 1984) can be utilized.

Examples of the pigments include black pigments, yellow pigments, orange pigments, brown pigments, red pigments, violet pigments, blue pigments, green pigments, fluorescent pigments, metal powder pigments, and polymer bonding pigments. Specifically, insoluble azo pigments, azolake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinaphthalone pigments, dyeing lake pigments, azine pigments, nitroso pigments, nitro pigments, natural pigments, fluorescent pigments, inorganic pigments, carbon black and the like can be used.

These pigments may be used without surface treatment, and surface treatment may also be performed. As the method of surface treatment, a method of coating the surface of pigments particles with a resin or wax, a method of adhering a surfactant to pigment particles, a method of bonding a reactive substance (for example, silane coupling agent, epoxy compound, polyisocyanate and the like) to the surface of a pigment, and the like can be used. The above-mentioned surface treatment methods are described in "Kinzoku Sekken no Seishitsu to Oyo" (Saiwai Shobo), "Insatsu Inki Gijutsu" (published by CMC, 1984) and "Saishin Ganryo Oyo Gijutsu" (published by CMC, 1986).

The particle size of the pigment lies preferably within the range from 0.01 μm to 10 μm, more preferably from 0.05 μm to 1 μm, and particularly preferably from 0.1 μm to 1 μm. When the particle size of the pigment is less than 0.01 μm, the dispersed substance in a photosensitive layer application solution is unstable, and when it exceeds 10 μm, a uniform photosensitive layer cannot be obtained.

As the method of dispersing a pigment, known dispersing technologies used in ink production, toner production and the like can be used. As the dispersing machine, a ultrasonic dispersing machine, sand mill, attritor, pearl mill, super mill, ball mill, impeller, disperser, KD mill, colloid mill, dynatron, three-roll mill, pressure kneaded and the like can be used. The details are described in "Saishin Ganryo Oyo Gijutsu" (published by CMC, 1986).

As the dye, commercially available dyes and known dyes described in literatures (for example, "Dye Handbook", edited by Yuki Gosei Kagaku Kyokai, 1970) can be utilized. Specifically, dyes such as azo dyes, metal complex salt azo dyes, pyrazoloneazo dyes, anthraquinone dyes, phthalocyanine dyes, carbonium dyes, quinoneimine dyes, methine dyes, cyanine dyes and the like can be used.

In the invention, among these pigments and dyes, those absorbing infrared light or near infrared light are particularly preferable since they are suitable for utilization with laser emitting infrared light or near infrared light.

As the pigment absorbing such infrared light or near infrared light, carbon black is preferably used. As the dye absorbing infrared light or near infrared light, for example, cyanine dyes described in JP-A Nos. 58-125246, 59-84356, 59-202829, 60-78787 and the like, methine dyes described in JP-A Nos. 58-173696, 58-181690, 58-194595 and the like, naphthoquinone dyes described in JP-A Nos. 58-112793, 58-224793, 59-48187, 59-73996, 60-52940, 60-63744 and the like, squalirium dyes described in JP-A Nos. 58-112792 and the like, cyanine dyes described in GB Patent No. 434,875, and the like can be used.

As the dye, near infrared absorbing sensitizers described in U.S. Pat. No. 5,156,938 are also suitably used, and substituted arylbenzo(thio)pyrylium salts described in U.S. Pat. No. 3,881,924, trimethinethiapyrylium salts described in JP-A No. 57-142645 (U.S. Pat. No. 4,327,169), pyrylium compounds described in JP-A Nos. 58-181051, 58-220143, 59-41363, 59-84248, 59-84249, 59-146063 and 59-146061, cyanine dyes described in JP-A No. 59-216146, pentamethinethiopyrylium salts described in U.S. Pat. No. 4,283,475, pyrylium compounds, Epolight III-178, Epolight III-130, Epolight III-125 and the like disclosed in Japanese Patent Application Publication (JP-B) Nos. 5-13514 and 5-19702, and the like are particularly preferably used.

The particularly preferable other examples of the dye include near infrared absorbing dyes represented by the formulae (I) and (II) in the specification of U.S. Pat. No. 4,756,993.

These pigments or dyes can be added into a printing plate material in an amount of 0.01 to 50% by weight, and preferably of 0.1 to 10% by weight, and in the case of dye, particularly preferably 0.5 to 10% by weight, in the case of pigment, particularly preferably 3.1 to 10% by weight, based on the total weight of printing plate material solid components. When the addition amount of the pigment or dye is less than 0.01% by weight, sensitivity decreases, and when it exceeds 50% by weight, the resultant photosensitive layer is not uniform, and durability of a recording layer deteriorates.

The dye or pigment may be added with other components to the same layer, or added to other layer separately provided. In the case of addition into other layer, it is desirable to add the dye or pigment into a layer adjacent to a layer containing a substance which is thermally decomposable and decreases substantially the solubility of the binding agent when it does not decompose. The dye or pigment and the binder resin are preferably contained in the same layer, however, may be contained in separate layers.

In the invention, instead of the compound (B) which lowers the solubility of the polymer compound in an alkali aqueous solution because of its compatibility with the alkali aqueous solution-soluble polymer compound, with the solubility-decreasing action being reduced by heat, and the compound (C) that generates heat by absorbing light, one compound having properties of both of them (hereinafter, appropriately referred to as (B+C) component) can also be contained, and as this compound, for example, those of the above-mentioned general formula (I) can be used.

The above-mentioned compound [(B+C) component] has a property of absorbing light and generating heat (namely, property of the component (C)), has an absorption region in the infrared range from 700 nm to 1200 nm, further shows excellent compatibility with an alkali aqueous solution-soluble polymer compound, is a basic dye and has in the molecule a group mutually acting with an alkali aqueous solution-soluble polymer compound such as an ammonium group, imminium group and the like (namely, property of the component (B)), therefore, the (B+C) component can act mutually with the polymer compound to control alkali aqueous solution-solubility thereof, and can be suitably used in the invention.

In the above-mentioned general formula (I), $R_1$ to $R_4$ represent each independently a hydrogen atom, an alkyl group having 1 to 12 carbon atoms, alkenyl group, alkoxy group, cycloalkyl group or aryl group each optionally having a substituent, and $R_1$ and $R_2$, and $R_3$ and $R_4$ may bond to each other to form a cyclic structure. As $R_1$ to $R_4$, specifically, a hydrogen atom, methyl group, ethyl group, phenyl group, dodecyl group, naphthyl group, vinyl group, allyl group, cyclohexyl group and the like can be used. When these groups has a substituent, examples of the substituent include halogen atoms, carbonyl group, nitro group, nitrile group, sulfonyl group, carboxyl group, carboxylates, sulfonates and the like.

$R_5$ to $R_{10}$ represent each independently an alkyl group having 1 to 12 carbon atoms optionally having a substituent, and as $R_5$ to $R_{10}$, specifically, a methyl group, ethyl group, phenyl group, dodecyl group, naphthyl group, vinyl group, allyl group, cyclohexyl group and the like can be used. When these groups has a substituent, examples of the substituent include halogen atoms, carbonyl group, nitro group, nitrile group, sulfonyl group, carboxyl group, carboxylates, sulfonates and the like.

$R_{11}$ to $R_{13}$ represent each independently a hydrogen atom, halogen atom or an alkyl group having 1 to 8 carbon atoms optionally having a substituent, $R_{12}$ may bond to $R_{11}$ or $R_{13}$ to form a ring structure, and when m>2, a plurality of $R_{12}$s may bond to each other to form a ring structure. As $R_{11}$ to $R_{13}$, specifically, chlorine atom, cyclohexyl group, or cyclopentyl ring, or cyclohexyl ring and the like formed by mutual bonding of $R_{12}$s can be used. When these groups have a substituent, examples of the substituent include halogen atoms, carbonyl group, nitro group, nitrile group, sulfonyl group, carboxyl group, carboxylates, sulfonates and the like. m represents an integer of 1 to 8, and preferably 1 to 3.

$R_{14}$ to $R_{15}$ represent each independently a hydrogen atom, halogen atom or an alkyl group having 1 to 8 carbon atoms optionally having a substituent, and $R_{14}$ and $R_{15}$ may bond to each other to form a ring structure, and when m>2, a plurality of $R_{14}$s may bond to each other to form a ring structure. As $R_{14}$ to $R_{15}$, specifically, a chlorine atom, cyclohexyl group, or cyclopentyl ring, cyclohexyl ring and the like formed by mutual bonding of $R_{14}$s can be used. When these groups have a substituent, examples of the substituent include halogen atoms, carbonyl group, nitro group, nitrile group, sulfonyl group, carboxyl group, carboxylates, sulfonates and the like. m represents an integer of 1 to 8, and preferably 1 to 3.

In the above-mentioned general formula (I), specific examples of the anion represented by $X^-$ include perchloric acid, tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzensulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, p-toluenesulfonic acid and the like. Among them, particularly, hexafluorophosphoric acid, and alkyl aromatic sulfonic acids such as triisopropylnaphthalenesulfonic acid and 2,5-dimethylbenzenesulfonic acid, are suitable.

The compound of the above-mentioned general formula (I) is a compound generally called a cyanine dye, and specifically, compounds shown below are suitably used, however, the scope of the invention is not limited to these specific examples.

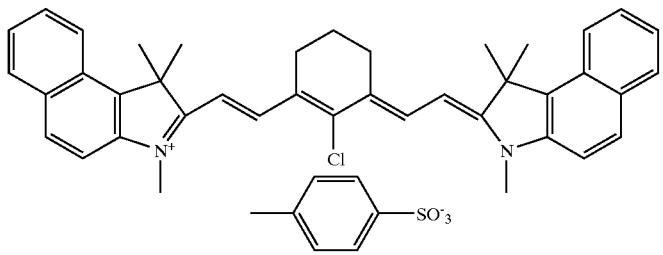

Cyanine dye A

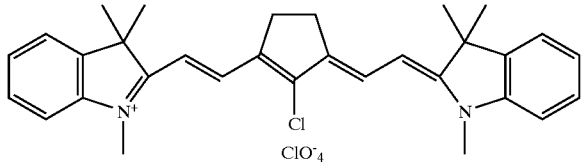

Cyanine dye B

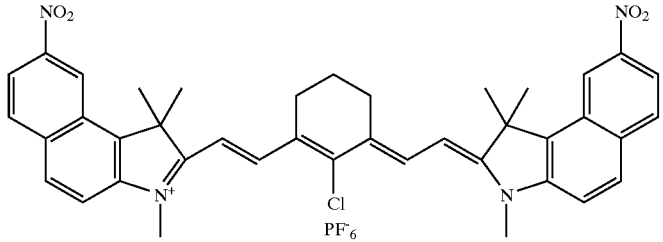

Cyanine dye C

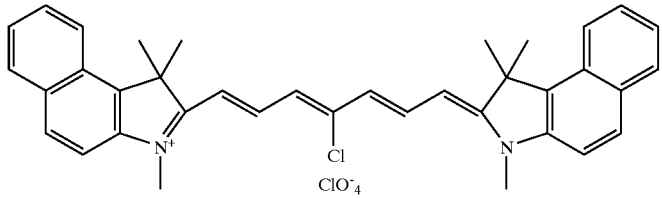

Cyanine dye D

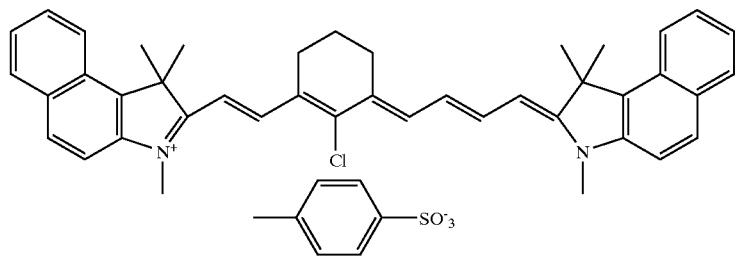

Cyanine dye E

In the invention, when, instead of the component (B) and the component (C), compounds having properties of both of them [(B+C) component] such as the above-mentioned cyanine dyes are used, the addition amount of the compound is preferably from 99/1 to 70/30 from the standpoint of sensitivity, and more preferably from 99/1 to 75/25, to the amount of the component (A).

To the positive photosensitive composition of the invention, various additives can be added further, if necessary. For example, for the purpose of improving sensitivity, phenols and organic acids can also be used together. As the phenols, bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3',5'-tetramethyltriphenylmethane and the like can be used. Further, examples of the organic acids include sulfonic acids, sulfinic acids, alkylsulfric acides, phosphonic acids, phosphates and carboxylic acids and these compounds are described in JP-A Nos. 60-88942 and 2-96755 and the like, and specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, ascorbic acid and the like.

The proportion of the above-mentioned phenols and organic acids in a printing plate material is preferably from 0.05 to 20% by weight, more preferably from 0.1 to 15% by weight, and particularly preferably from 0.1 to 10% by weight.

Further, the printing plate material of the invention may contain a nonionic surfactant as described in JP-A Nos. 62-251740 and 3-208514, and an amphoteric surfactant as described in JP-A Nos. 59-121044 and 4-13149 in order to enhance stability of treatment under development conditions.

Specific examples of the nonionic surfactant include sorbitan tristearate, sorbitan monopalmitate, sorbitan trioleate, stearic monoglyceride, polyoxyethylene nonylphenyl ether and the like.

Specific examples of the amphoteric surfactant include alkyldi(aminoethyl)glycine, alkylpolyaminoethylglycine hydrochloride, 2-alkyl-N-carboxyethyl-N-hydroxyethylimidazolium betaines, N-tetradecyl-N,N-betaine (for example, trade name: Amogen K: manufactured by Dai-ichi Kogyo K.K.) and the like.

The proportion of the above-mentioned nonionic surfactant and amphoteric surfactant in a printing plate material is preferably from 0.05 to 15% by weight, and more preferably from 0.1 to 5% by weight.

The printing plate material of the invention can contain a printing out agent for obtaining a visible image directly after heating by exposure, and a dye and a pigment as an image coloring agent.

As the printing out agent, combinations of compounds releasing an acid by heating in exposure (light acid releasing agent) with organic dyes which can form a salt are typically used. Specifically, a combination of o-naphthoquinonediazide-4-sulfonic halogenide with a salt-forming organic dye described in JP-A Nos. 50-36209 and 53-8128, and a combination of a trihalomethyl compound with a salt-forming organic dye described in JP-A Nos. 53-36223, 54-74728, 60-3626, 61-143748, 61-151644 and 63-58440 can be used. As such a trihalomethyl compound, oxazole compounds and triazine compounds can be used, and both compounds are excellent in stability with time and give clear printed out images.

As the image coloring agent, other dyes can be used as well as the above-mentioned salt-forming organic dyes. In addition to salt-forming organic dyes, oil-soluble dyes and basic dyes are preferable. Specific examples of the image coloring agent include Oil Yellow #101, Oil Yellow #103, Oil Pinc #312, Oil Green BG, Oil Blue BOS, Oil Blue #603, Oil Black BY, Oil Black BS, Oil Black T-505 (these are manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015) and the like. Further, dyes described in JP-A No. 62-293247 are particularly preferable. The dye can be added into a printing plate material in a proportion of 0.01 to 10% by weight, and preferably 0.1 to 3% by weight, based on the total weight of printing plate material solid components.

Further, plasticizers are added into the printing plate material of the invention, if necessary, for imparting flexibility and the like of a film. For example, oligomers and polymers of butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, acrylic acid or methacrylic acid, and the like are used.

Furthermore, long chain fatty esters, long chain fatty amides and the like may be added, for improving film strength.

An image recording material to which the plate-making method of the invention can be applied can be produced, usually, by dissolving the above-mentioned components in a solvent and applying the solution on a suitable support. Examples of the solvent used here include, but are not limited to, ethylene dichloride, cyclohexanone, methyl ethyl ketone, methanol, ethanol, propanol, ethylene glycol monomethyl ether, 1-methoxy-2-propanol, 2-methoxy ethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene and the like. These solvents are used alone or in admixture. The concentration of the above-mentioned component (total solid content including additives) in a solvent is preferably from 1 to 50% by weight. The application amount (solid content) on a support obtained after application and drying is preferably from 0.5 to 5.0 g/m$^2$ in the case of a photosensitive printing plate, though it differs depending on use. As the method of application, various methods such as bar coater application, rotation application, spray application, curtain application, dip application, air knife application, blade application, roll application and the like can be used. When the application amount decreases, apparent sensitivity increases, while film properties of a photosensitive film decreases.

A surfactant for improving application property, for example, fluorine-containing surfactants as described in JP-A No. 62-170950 can be added to the photosensitive layer in the invention. The addition amount is preferably from 0.01 to 1% by weight, and preferably from 0.05 to 0.5% by weight, based on the total weight of printing plate materials.

The support used in the invention is a plate dimensionally stable, and examples thereof include paper, paper laminated with plastics (for example, polyethylene, polypropylene, polystyrene and the like), metal plates (for example, aluminum, zinc, copper and the like), plastic films (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal and the like), paper or plastic films laminated or vapor-deposited with metals as described above, and the like.

As the support of the invention, polyester films and aluminum plate are preferable, and among them, an aluminum plate having excellent dimension stability and relatively cheap is particularly preferable. The suitable aluminum plate is a pure aluminum plate and an alloy plate essentially composed of aluminum and containing a trace amount of extraneous elements, and further, plastic films laminated or vapor-deposited with aluminum may also be used. The extraneous elements contained in an aluminum alloy are silicon, iron, manganese, copper, magnesium, chromium, zinc, bismuth, nickel, titanium and the like. The content of the extraneous elements in an alloy is 10% by weight or less. The particularly suitable aluminum in the invention is pure aluminum, however, since it is difficult to produce completely pure aluminum from the standpoint of the refining technology, those containing a slight amount of extraneous elements may also be used. The aluminum plate thus used in the invention is not specified in its composition, and aluminum plates made of materials conventionally known and used can be appropriately utilized. The aluminum plate used in the invention has a thickness of about 0.1 mm to 0.6 mm, preferably of 0.15 mm to 0.4 mm, and particularly preferably of 0.2 mm to 0.3 mm.

Prior to surface-roughening of an aluminum plate, degreasing treatments with a surfactants, organic solvent or alkali aqueous solution is conducted for removing a rolling oil on the surface, if necessary.

The treatment of roughening the surface of an aluminum plate is conducted by various methods such as a method of mechanical roughening, a method of solving and roughening the surface electrochemically, and a method of selectively solving the surface chemically. As the mechanical method, known methods can be used such as a ball polishing method, brush polishing method, blast polishing method, buff polishing method and the like. As the electrochemical roughening method, there are methods of roughening by alternating current or direct current in a hydrochloric acid or nitric acid electrolyte. As disclosed in JP-A No. 54-63902, a method combining both of them can also be utilized.

The aluminum plate thus roughened is subjected, if necessary, to alkali etching treatment and neutralization treatment, and then anodizing treatment is performed for enhancing the water holding property and wear resistance of the surface, if desired. As the electrolyte used for anodizing treatment of an aluminum plate, various electrolytes forming a porous oxide film can be used, and generally, sulfuric acid, phosphoric acid, oxalic acid, chromic acid or mixed acids thereof are used. The concentration of the electrolyte is appropriately determined depending on the kind of the electrolyte.

The treatment conditions for anodizing cannot be indiscriminatively specified since they differ variously depending on the electrolyte used, but in general, the concentration of electrolyte is from 1 to 80% by weight, the liquid temperature is from 5 to 70° C., the current density is from 5 to 60 A/dm$^2$, the voltage is from 1 to 100 V and the electrolysis time is from 10 seconds to 5 minutes.

When the amount of an anodized film is less than 1.0 g/m$^2$, printing resistance is insufficient, non-image portions of a planographic printing plate are easily scratched, and so-called "scratch blur" in which ink adheres to a scratched portion at the time of printing tends to occur.

After anodizing treatment, hydrophilization treatment is performed on the surface of aluminum, if necessary. As the hydrophilization treatment used in the invention, there is an alkali metal silicate method (for example, sodium silicate aqueous solution method) as disclosed in U.S. Pat. Nos. 2,714,066, 3,181,461, 3,280,734 and 3,902,734. In this method, a support is immersed or electrolyzed in a sodium silicate aqueous solution. Additionally, treatments with potassium fluorozirconate disclosed in JP-B No. 36-22063 or polyvinylphosphonic acid as described in U.S. Pat. Nos. 3,276,868, 4,153,461 and 4,689,272, and the like can be used.

The image recording material according to the invention has a positive printing plate material provided on a hydrophilic support, and if necessary, an undercoat layer can be provided between them.

As the undercoat layer component, various organic compounds are used, and carboxymethyl cellulose, dextran, gum arabic; phosphonic acids having an amino group such as 2-aminoethylphosphonic acid and the like; organic phosphonic acids optionally having a substituent such as phenylphosphonic acid, naphthylphosphonic acid, alkylphosphonic acid, glycerophosphonic acid, methylene diphosphonic acid and ethylene diphosphonic acid, and the like; organic phosphoric acids optionally having a substituent such as phenylphosphoric acid, naphthylphosphoric acid, alkylphosphoric acid and glycerophosphoric acid, and the like; organic phosphinic acids optionally having a substituent such as phenylphosphinic acid, naphthylphosphinic acid, alkylphosphinic acid and glycerophosphinic acid, and the like; amino acids such as glycine, β-alanine and the like; and hydrochlorides of amines having a hydroxyl group such as a hydrochloride of triethanolamine, and the like; may be used in admixture of two or more.

This organic undercoat layer can be provided by the following method. Namely, there are a method in which a solution prepared by dissolving the above-mentioned organic compound in water or an organic solvent such as methanol, ethanol, methyl ethyl ketone or the like or a mixed solvent thereof is applied on an aluminum plate, and dried to provide an organic undercoat layer, and a method in which an aluminum plate is immersed into a solution prepared by dissolving the above-mentioned organic compound in water or an organic solvent such as methanol, ethanol, methyl ethyl ketone or the like or a mixed solvent thereof, to allow the above-mentioned compound to adsorb to the plate, and then the plate is washed with water and the like and dried to provide an organic undercoat layer. In the former method, a solution of the above-mentioned organic compound having a concentration of 0.005 to 10% by weight can be applied by various methods. In the latter method, the concentration of a solution is from 0.01 to 20% by weight, and preferably from 0.05 to 5% by weight, the immersion temperature is from 20 to 90° C., and preferably from 25 to 50° C., and the immersion time is from 0.1 second to 20 minutes, and preferably from 2 seconds to 1 minute. pH of the solution used for this method can also be controlled within the range from 1 to 12 by a basic substance such as ammonia, triethylamine, potassium hydroxide and the like, and an acidic substance such as hydrochloric acid, phosphoric acid and the like. Further, a yellow dye can also be added for improving an ability of reproducing the tone of an image recording material.

The coating amount of the organic undercoat layer is appropriately from 2 to 200 mg/m$^2$, and preferably from 5 to 100 mg/m$^2$. When the above-mentioned coating amount is less than 2 mg/m$^2$, sufficient printing resistance is not obtained. Also when the above-mentioned coating amount exceeds 200 mg/m$^2$, the same disadvantageous phenomenon occurs.

A protective layer may be provided on a photosensitive layer of the image recording material of the invention, if necessary. As the protective layer component, polyvinyl alcohol and, a matting material used in ordinary photosensitive planographic printing plates, and the like can be used.

The positive image recording material produced as described above is usually imagewise exposed to light and developed.

The above-mentioned photosensitive layer has an advantage that a positive image can be formed by infrared laser, therefore, as the light source of active light beam used in image-wise exposure, light sources having light emitting wavelengths of 700 nm or more in the range from near infrared to infrared are preferable. As the light source in the plate-making process of the invention, solid-state laser and semiconductor laser capable of irradiating infrared ray having light emitting wavelengths preferably from 700 to 1200 nm are particularly preferable.

Alkali-based Developer

As the alkali aqueous solution containing at least one saccharide selected from non-reducing saccharides and at least one base, developers composed of a non-reducing sugar and a base, and those having a pH of 9.0 to 13.9, and particularly of 12.5 to 13.5 are preferable.

In the above-mentioned developer composed of a non-reducing sugar and a base, the non-reducing sugar means saccharide having no reducing property since it has neither an aldehyde group nor a ketone group which can become free state, and any of trehalose type oligosaccharides containing reducing groups mutually bonded, and glycosides in which reducing groups of saccharides bond to non-saccharides can be used As the above-mentioned trehalose type oligosaccharides, for example, saccharose and trehalose can be used, and as the above-mentioned glycosides, for example, alkyl glycosides, phenol glycosides and mustard oil glycosides can be used.

As a sugar-alcohol, for example, D,L-arabitol, ribitol, xylitol, dulcitol, D,L-mannitol, D,L-iditol, D,L-talitol, allodulcitol and the like can be used.

Further, rutitol obtained by hydrogenation of disaccharides, reduced forms (reduced starch syrup) obtained by hydrogenation of oligosaccharides, and the like can also be suitably used.

Among the above-mentioned compounds, as the non-reducing saccharides, sugar-alcohol and saccharose are preferable, and among others, D-sorbitol, saccharose and reduced starch syrup are more preferable since they show a buffering action in a suitable pH region.

These non-reducing saccharides may be used alone or in combination of two or more, and the proportion of them in a developer is preferably from 0.1 to 30% by weight, and more preferably from 1 to 20% by weight.

A conventionally known alkali agent can be appropriately used as a base with the non-reducing saccharide.

Examples of the above-mentioned alkali agent include inorganic alkali agents such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogen carbonate, potassium hydrogen carbonate, ammonium hydrogen carbonate, sodium borate, potassium borate, ammonium borate and the like, potassium citrate, tripotassium citrate, sodium citrate and the like.

Further, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diisopropanolamine, ethyleneimine, ethylenediamine, pyridine and the like can also be suitably used.

These alkali agents may be used alone or in combination of two or more.

Among the above-mentioned compounds, sodium hydroxide and potassium hydroxide are preferable. The reason for this is that pH can be controlled in a wider pH range by controlling the addition amount thereof for a non-reducing sugar.

Further, trisodium phosphate, tripotassium phosphate, sodium carbonate, potassium carbonate and the like are also preferable since they have themselves a buffering action.

As for the alkali developing treatment solution used in the invention, at least one compound selected from the group consisting of compounds of the following formula (IA), compounds of the following formula (IIA), and salts thereof is contained in an alkali aqueous solution as described above.

(IA)

(IIA)

wherein, R$^1$ and R$^2$ each represent a hydrocarbon group having 4 to 30 carbon atoms, and m, n and p each represent an integer of 1 to 10.

Examples of the salts of compounds of the above-mentioned formulae include alkali metal salts, for example, sodium salts, potassium salts, lithium salts, ammonium salts, amine salts, and the like. The hydrocarbon groups $R^1$ and $R^2$ in the formula may be saturated or unsaturated, and preferable are unsaturated hydrocarbon groups. Compounds of the formula (IIA) wherein n is the same as p are often used.

The above-mentioned compounds and salts thereof can be produced by ordinary methods. Moreover, they can be obtained as commercially available products such as Pionine C-158 manufactured by Takemoto Oil & Fat Co., Ltd. and the like.

The above-mentioned compound is adsorbed on a deposited insoluble material derived from a binder resin and an infrared absorbent in an alkali developing treatment solution, and dispersibility of the insoluble material is improved by surface activity thereof, and adhesion of the insoluble material to the plate surface and precipiration thereof can be thus prevented.

The above-mentioned compound has itself excellent surface activity and also has excellent solubility in an alkali developing treatment solution, and can prevent deposition of effective components contained in the alkali developing treatment solution and can improve solubility thereof, and therefore, there is also an advantage that higher concentration of a developer can be accomplished by using this compound. Accomplishment of higher concentration of an alkali developing processing solution performs significant effects in handling and reduction of an apparatus, such as preservation of a development processing solution, improvement in conveying efficiency, reduction in the volume of a replenishing tank, and the like. Further, in the developing apparatus effecting development repeatedly, adhesion of insoluble materials and deposition of effective components can be prevented for a long period of time and stable development can be conducted without influencing various properties of the development processing solution and without controlling pH and component balance such as mixing ratio ($SiO_2/M_2O$) and the like.

The content of the above-mentioned compound in an alkali developing treatment solution is preferably from 0.001 to 10% by mass, more preferably from 0.005 to 1% by mass, and most preferably from 0.01 to 0.5% by mass.

When the above-mentioned content is less than 0.001% by mass, an effect of suppressing generation of an insoluble material is poor, and when it exceeds 10% by mass, developing property may deteriorate.

To the alkali developing treatment solution used in the invention, the following additives can be added for the purpose of further enhancing the developing ability.

Examples thereof include neutral salts such as NaCl, KCl, KBr and the like described in JP-A No. 58-75152, chelating agents such as EDTA, NTA and the like described in JP-A No. 58-190952, complexes such as $[Co(NH_3)_6]Cl_3$, $CoCl_2 \cdot 6H_2O$ and the like described in JP-A No. 59-121336, anionic or amphoteric surfactants such as sodium alkylnaphthalenesulfonate, N-tetradecyl-N,N-dihydroxyethylbetaine and the like described in JP-A No. 50-51324, nonionic surfactants such as tetramethyldecindiol and the like described in U.S. Pat. No. 4,374,920, cationic polymers such as methylchloride quaternalized substance of p-dimethylaminomethylpolystyrene, and the like described in JP-A No. 55-95946, amphoteric polymer electrolytes such as a copolymer of vinylbenzyl trimethyl ammonium chloride and sodium acrylate, and the like described in JP-A No. 56-142528, reducing inorganic salts such as sodium sulfite and the like described in JP-A No. 57-192951, inorganic lithium compounds such as lithium chloride and the like described in JP-A No. 58-59444, organic boron compounds described in JP-A No. 59-75255, quaternary ammonium salts such as tetraalkyl ammonium oxides and the like described in EP 101,010, and the like. Brush member As the substrate, fabric is preferable, and as the hairy material, natural fiber, artificial fiber or metal fiber is preferable.

In order to obtain suitable rigidity, when the hairy material is natural fiber or artificial fiber, the breadth D of the hairy material is 1 to 10,000 denier/hair, the length of the hairy material is 1 to 35 mm, and the density P of the above-mentioned hairy material formed as a brushing band is 1,000 to 200,000 denier/cm$^2$ (wherein, P=D×number of hairy material per unit area (number/cm$^2$)).

In this case, the correlation of the breadth of the hairy material (denier/hair) and the length L (mm) of the hairy material is $1 \leq L \leq 7.5 \times (\log D + (2/3))$.

When the material of the hairy material is metal fiber, the hair diameter R of the hairy material is 10 to 200 $\mu$m, the length of the hairy material is 1 to 30 mm, and the density P of the above-mentioned hairy material formed as a brushing band is 0.05 to 7.0 mm$^2$/cm$^2$ (wherein, P=sectional area per one hairy material (mm$^2$/hair)×number of hairy material per unit area (number/cm$^2$)).

In this case, the correlation of the hair diameter R of the hairy material ($\mu$m/hair) and the length L (mm) of the hairy material is $1 \leq L \leq 0.1R + 10$.

Figure 7:
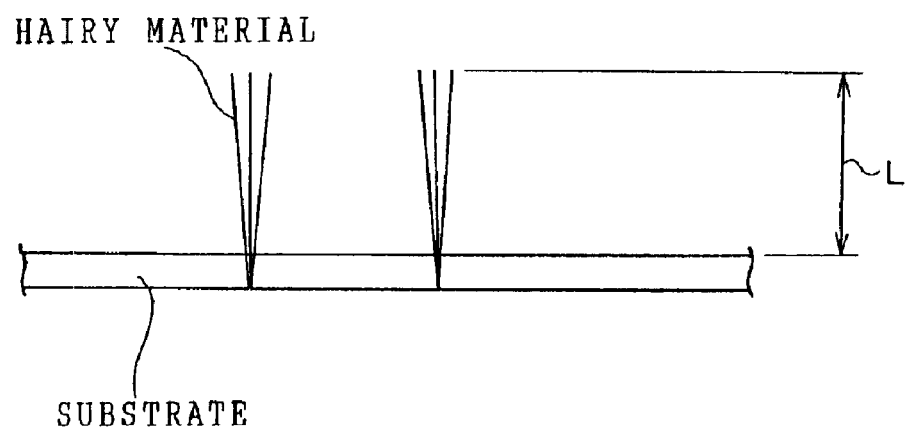
FIG. 7 is a sectional view of a brush member for defining the length L of a hairy material.

The length L of the hairy material is, as shown in FIG. 7, the length projecting from the surface of a substrate.

[Reason for Numerical Value Restriction]

(1) Length of Hairy Material

Natural/artificial fiber: $1 \leq L \leq 7.5 \times (\log D + (2/3))$

Metal fiber: $1 \leq L \leq 0.1R + 10$

When L is less than 1, the use period of the hairy material is too short, and such a hairy material cannot be used (cannot be used when slightly worn)

When L exceeds the upper limit, the rigidity of the hairy material is weaker, and abrasion effect disappears.

(2) Breadth of Hairy Material

Natural/artificial fiber: 1 to 10000 denier/hair

Hair diameter of hairy material

Metal fiber: 10 to 200 $\mu$m/hair

Figure 8:
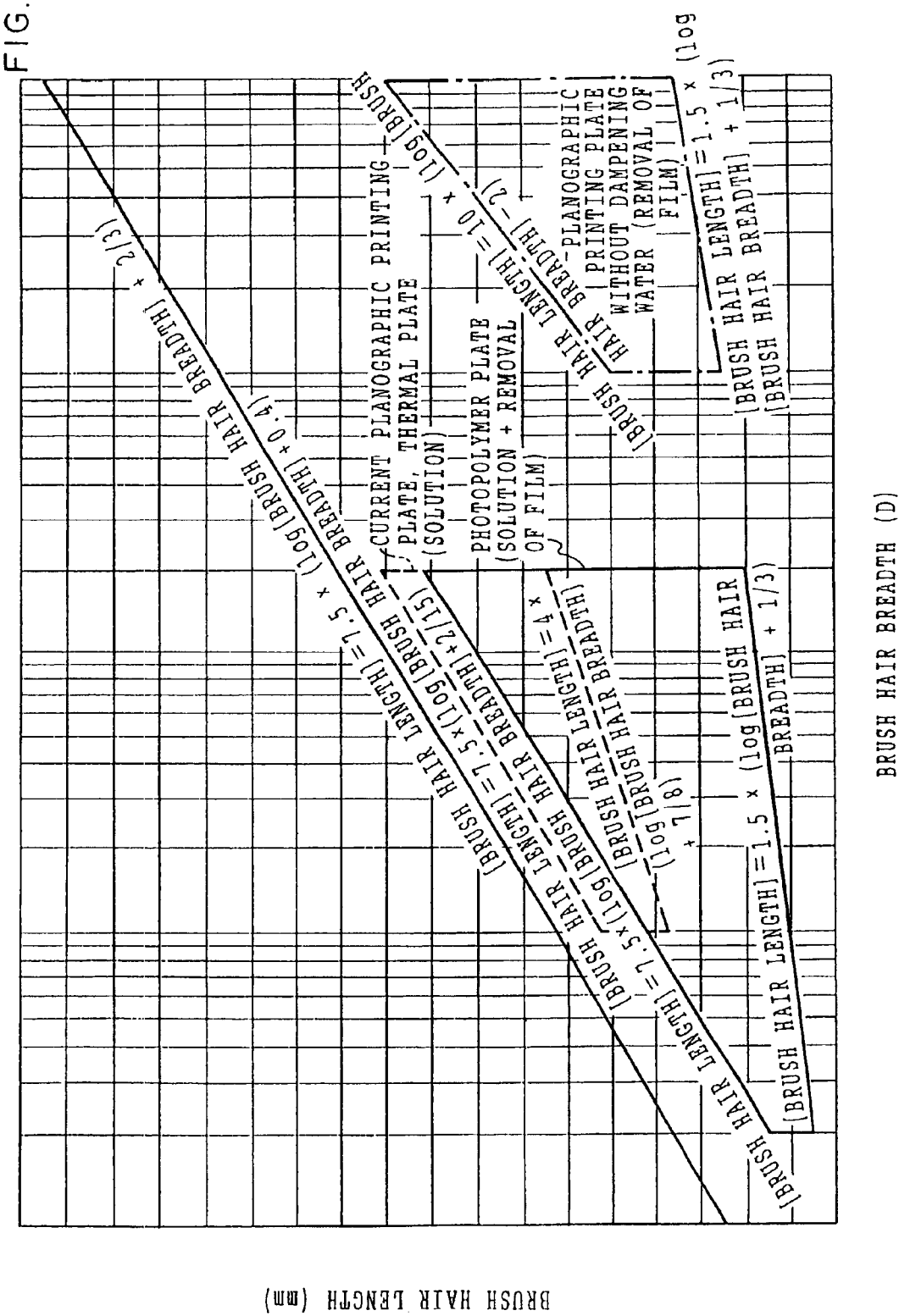
FIG. 8 is a line view showing suitabilities of various printing plates, in correlations between the breadth and length of a hairy material.

As shown in FIG. 8, the material of the hairy material whose breadth is less than the lower limit cannot be found, and when the breadth exceeds the upper limit, finished image quality deteriorates.

(3) Density of Hairy Material

Natural/artificial fiber: 1,000 to 200,000 denier/hair

Metal fiber: 0.05 to 7.0 mm$^2$/cm$^2$

When the density is less than the lower limit, abrasion effect is not obtained, and a product whose density exceeds the upper limit is difficult to manufacture from the standpoint of production.

When abrasion is taken into account, higher density is more advantageous, and when stirring effect is taken into consideration, lower density is preferable in view of balance with abrasion effect.

An embodiment of the invention will be described below referring to drawings. FIG. 10 shows a basic constitution of an automatic developing apparatus 10 applied to the embodiment. This automatic developing apparatus 10 is applied to developing a photosensitive planographic printing plate (hereinafter, referred to as "thermal positive printing plate 12") which has been imagewise exposed to light by an exposing apparatus not shown.

Figure 2:
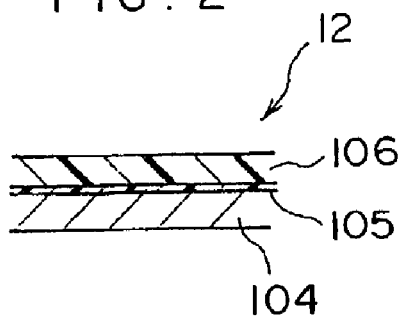
FIG. 2 is a sectional view of a photosensitive planographic printing plate applied to the embodiment.

The thermal positive printing plate 12 to be developed by the automatic developing apparatus 10 of this embodiment is a one-sided thermal (positive type) plate obtained by forming a photosensitive layer 106 via an adhesive layer 105 on one surface of a thin support 104 comprised of aluminum and the like, as shown in FIG. 2. An original film on which original images are formed is closely placed on the photosensitive surface of this thermal positive printing plate 12, and image-wise exposure is conducted on the printing plate.

The automatic developing apparatus 10 comprises a developing zone 14 in which the thermal positive printing plate 12 is treated with a developer, a rinsing zone 16 which feeds rinsing water and washes the thermal positive printing plate 12 treated with a developer, a de-sensitizing treatment zone 18 in which gum liquid for plate surface protection is applied to the thermal positive printing plate 12 after washing with water, to effect de-sensitizing treatment, and a drying zone 20 in which the thermal positive printing plate 12 is dried. Namely, in the automatic developing apparatus 10, a development process, rinsing process, de-sensitizing process and drying process are placed in this order, along the conveying direction (arrow A in FIG. 1) of the thermal positive printing plate 12.

In the automatic developing apparatus 10, a treatment tank 22 is provided. In this treatment tank 22, a development bath 24 is provided at a position corresponding to a development zone 14, as a processing bath, and a rinsing bath 26 and a de-sensitizing treatment bath 28 are provided at positions corresponding to a rinsing zone 16 and a de-sensitizing treatment zone 18. In the treatment tank 22, a space of an insertion portion 34 is provided at the upper-stream side of the development bath 24 (upper stream side of conveying direction of thermal positive printing plate 12), and a space for the drying zone 20 is provided at the downstream side of the de-sensitizing treatment bath 28.

In an outer plate panel 30 covering the periphery of the treatment tank 22, an insertion port 32 in the form of slit is formed to allow the thermal positive printing plate 12 to enter the automatic developing apparatus 10 (left side of paper surface of FIG. 1), and in the treatment tank 22, an insertion portion 34 is formed at the insertion port 32 side of the development zone 14.

In the automatic developing apparatus 10, covers 36 and 38 for covering the upper portion of the treatment tank 22 and the upper portion of the drying zone 20 are provided. The cover 36 at the insertion port 32 side covers the upper portion of the insertion portion 34 of the treatment tank 22 and the rinsing zone 16, and the cover 38 is so placed as to cover the upper portion of the rinsing zone 16 and the upper portion of the drying zone 20.

In the cover 36, an insertion port (sub-insertion port) 40 for re-entry through which the thermal positive printing plate 12 is inserted to rinsing zone 16 is provided between the development zone 14 and the rinsing zone 16. This sub-insertion port 40 is used for insertion of the thermal positive printing plate 12 for conducting treatments by the PS plate processor 10 which does not need treatment in the development zone 14.

In the insertion part 34 adjacent to the insertion port 40, a pair of rubber conveying rollers 42 is provided. The thermal positive printing plate 12 on which images have been printed is conveyed to a nip between the pair of the conveying rollers 42, by being inserted through the insertion port 32 along the direction of the arrow A.

The pair of the conveying rollers 42 transports the thermal positive printing plate 12 to the development zone 14 at an angle of about 15° to 31° to the horizontal direction, while pulling this thermal positive printing plate 12 from the insertion port 32 by rotation. The thermal positive printing plate 12 is inserted through the insertion port 32 to the automatic developing apparatus 10 used for treatment of the one-sided thermal positive printing plate 12, while a photosensitive layer (photosensitive surface) faces up. Namely, the thermal positive printing plate 12 is treated by the automatic developing apparatus 10, while a photosensitive surface faces up.

In the development bath 24 provided in the treatment tank 22, the bottom center projects downward to form an approximate peak, and a developer used for developing the thermal positive printing plate 12 is stored therein.

In this development bath 24, a conveying roller 48 is placed at the insertion portion 34 side which is an upper-stream side of the conveying path of the thermal positive printing plate 12. Further, in the development bath 24, a pair of the conveying rollers 50 is placed at the center portion of the conveying path of the PS plate, and a pair of the conveying rollers 52 is placed at the rinsing zone 16 side which is disposed at a downstream side.

In the development bath 24, a conveying path in the form of substantially U shape through which the thermal positive printing plate 12 is conveyed while immersed in a developer in the development bath 24 is formed by providing conveying components such as a guide plate, conveying roller and the like based on the kind of the thermal positive printing plate 12 to be treated, and a brush roller used as a rubbing member and a back-up roller and a guide plate between the conveying roller 48 and the pair of the conveying rollers 50 and between the pair of the conveying rollers 50 and the pair of the conveying rollers 52.

In the development bath 24, a brush roller 142 and a conveying roller 60 are placed between the pairs of the conveying rollers 50, 52. The brush roller 142 is used as one example of a rubbing member, and the brush roller 142 and the conveying roller 60 are disposed so that they face the upper surface of the thermal positive printing plate 12 conveyed between the pairs of the conveying rollers 50, 52. The brush roller 142 brushes a photosensitive layer as the upper surface of the thermal positive printing plate 12 by contacting the upper surface while rotating toward a predetermined direction to promote removal of unnecessary portions of the photosensitive layer by a developer.

The thermal positive printing plate 12 pulled in through the insertion port 32 by the pair of the conveying rollers 42 passes below the conveying roller 48, is conveyed into a nip between the pair of the conveying rollers 50 and guided in inclined upper direction toward the pair of the conveying rollers 52 by the conveying roller 50 so that the plate moves along the bottom surface of the development bath 24. In this operation, the upper surface of the thermal positive printing plate 12 is brushed by the brush roller 142.

The pair of the conveying rollers 52 has, for example, an outer peripheral surface made of rubber and sandwiches the thermal positive printing plate 12 and conveyes it into the rinsing zone 16 while pulling it out from the development bath 24.

In the development bath 24, spray pipes 54, 56 are provided between the conveying roller 48 and the pair of the conveying rollers 50, and near the bottom surface between the pair of the conveying rollers 50 and the pair of the conveying rollers 52. A developer in the development bath 24 sucked by a pump not shown is fed into these spray pipes 54, 56, and this developer is ejected from the spray pipes 54, 56. Thus, a developer in the development bath 24 is stirred, and uniform treatment of the thermal positive printing plate 12 can be attained. In this operation, by ejecting a developer along width direction which crosses the conveying direction of the thermal positive printing plate 12, from the spray pipe 54, the developer ejected from the spray pipe 54 reaches the upper and lower surfaces of the thermal positive printing plate 12 conveyed in the developing bath 24, to give quick development treatment of the thermal positive printing plate 12 and to prevent generation treatment unevenness.

The thermal positive printing plate 12 pulled out from the development bath 24 by the pair of the conveying rollers 52 is conveyed into the rinsing zone 16 while a developer adhered to the surface is squeezed off by this pair of the conveying rollers 52.

In the rinsing zone 16, a conveying path along which the thermal positive printing plate 12 is conveyed approximately horizontally by pairs of the conveying rollerss 62, 64 placed above the rinsing bath 26 is formed, and the thermal positive printing plate 12 is conveyed horizontally above the rinsing bath 26 while being sandwiched by the pairs of the conveying rollers 62, 64.

In the rinsing zone 16, spray pipes 66, 68 are provided, at upper and lower positions sandwiching the conveying path of the thermal positive printing plate 12, between the pairs of the conveying rollers 62, 64. The axis direction of the spray pipes 66, 68 is placed along the width direction of the thermal positive printing plate 12 (direction crossing the conveying direction), and a plurality of discharge holes (not shown) facing the conveying path of the thermal positive printing plate 12 are formed along the axis direction.

In the rinsing bath 26, for example, water is stored as a rinsng agent (hereinafter, referred to as "rinsing water"), and in the automatic developing apparatus 10, rinsing water in the rinsing bath 26 is fed to the spray pipes 66, 68 by a water feeding pump which is not shown and which is synchronized with conveying of the thermal positive printing plate 12. Thus, rinsing water is ejected from the spray pipes 66, 68 toward the thermal positive printing plate 12, to wash a developer adhered to the surface of the thermal positive printing plate 12 off.

Rinsing water fed to the thermal positive printing plate 12 is squeezed off from the upper and lower surfaces of the thermal positive printing plate 12 together with a developer and the like adhered to the upper and lower surfaces of the thermal positive printing plate 12, and recovered into the rinsing bath 26, by sandwiching and sending out the thermal positive printing plate 12 with the pair of the conveying rollers 64. The ejection directions of rinsing water from the spray pipes 66, 68 are the upperstream side of the conveying direction of the thermal positive printing plate 12 and the downstream side of the conveying direction of the thermal positive printing plate 12, respectively, however, other directions may be used. Fresh liquid of the rinsing water is fed to the rinsing bath 26 by a means not shown depending on the processing amount of the thermal positive printing plate 12.

In the de-sensitizing treatment zone 18, a pair of the conveying rollers 70 is provided above the de-sensitizing treatment bath 28, and the thermal positive printing plate 12 is conveyed toward the pair of the conveying rollers 70 by the pair of the conveying rollers 64, thus conveyed in the de-sensitizing treatment zone 18, then, sandwiched by the pair of the conveying rollers 70 and conveyed toward the drying zone 20.

In the de-sensitizing treatment zone 18, a spray pipe 72 is provided at the upper side of the conveying path of the thermal positive printing plate 12, and a spray pipe 74 is provided at the lower side of the conveying path. The spray pipes 72, 74 are placed at upper and lower positions sandwiching the conveying path of the thermal positive printing plate 12, with their longitudinal direction (axis direction) being along the width direction of the thermal positive printing plate 12. In the spray pipes 72, 74, a plurality of discharge holes are formed along the width direction of the thermal positive printing plate 12.

Gum liquid used for protecting the plate surface of the thermal positive printing plate 12 is stored in the de-sensitizing treatment bath 28, and this gum liquid is fed to the spray pipes 72, 74 with the feeding synchronizing with conveying of the thermal positive printing plate 12. The spray pipe 72 drops this gum liquid onto the thermal positive printing plate 12, and the dropped liquid is spread and applied on the surface of the thermal positive printing plate 12. The spray pipe 74 discharges the gum liquid from discharge holes onto the lower surface of the thermal positive printing plate 12, and the discharged gum liquid is applied on the surface of the thermal positive printing plate 12.

A protective film is formed with the gum liquid applied on the upper and lower surfaces of the thermal positive printing plate 12. The discharge direction of the gum liquid from the spray pipe 72 is not limited to the downstream side of the conveying direction of the thermal positive printing plate 12 and any directions may be permissible, alternatively it may be also permissible that a flow regulation plate is provided, and gum liquid sprayed onto this flow regulation plate is flown and dropped onto the surface of the thermal positive printing plate 12 while uniformly diffusing the gum liquid along the width direction of the thermal positive printing plate 12 by the flow regulation plate, and the gum liquid is applied on the thermal positive printing plate 12. Instead of the spray pipe 74, a discharge unit may also be used in which gum liquid is applied on the lower surface of the thermal positive printing plate 12 by movement of the thermal positive printing plate 12 while being in contact with discharged gum liquid.

In the de-sensitizing treatment zone 18, a washing spray 76 is provided above the pair of the conveying rollers 70, and a washing roller 78 rotating while contacting with the upper roller of the pair of the conveying rollers 70 is provided, and rinsing water is dropped via a flow regulation plate 80 onto a contact position of the upper roller of the pair of the conveying rollers 70 and the washing roller 78, from this washing spray 76, at a predetermined timing previously set, thus rinsing water is uniformly diffused on the outer peripheral surface of the upper roller of the pair of the conveying rollers 70, and gum liquid is washed off from the outer peripheral surface of the upper and lower rollers of the pair of the conveying rollers 70, to prevent gum liquid from adhering to the outer peripheral surface of the rollers and damaging the thermal positive printing plate 12.

The thermal positive printing plate 12 on which gum liquid has been applied in the de-sensitizing treatment zone 18 is sandwiched by the pair of the conveying rollers 70, and conveyed to the drying zone 20 in a state that the gum liquid slightly remains on the upper and lower surfaces (gum liquid remaining as a thin film).

In the developing apparatus, a partition board 82 is provided between the de-sensitizing treatment zone 18 and the drying zone 20. This partition board 82 is placed above the conveying path of the thermal positive printing plate 12 so that it faces the upper end of the treatment tank 22, and thus, an insertion port 84 in the form of slit is formed between the de-sensitizing treatment zone 18 and the drying zone 20. The partition board 82 has a double structure, and by this, a vent route in the form of groove is formed at the drying zone 20 side of the insertion port 84, and air in the drying zone 20 enters this vent route, thus, entering of air in the drying zone 20 through the insertion port 84 into the de-sensitizing treatment zone 18 is prevented.

In the drying zone 20, a supporting roller 86 supporting the thermal positive printing plate 12 is placed near the insertion port 84, and a pair of the conveying rollers 90 and a pair of the conveying rollers 92 are placed at the center portion of the conveying direction of the thermal positive printing plate 12 and near the discharge port 88. The thermal positive printing plate 12 is conveyed in the drying zone 20 by the supporting roller 86 and the pairs of the conveying rollers 90, 92.

Between the supporting roller 86 and the pair of the conveying rollers 90 and between the pair of the conveying rollers 90 and the pair of the conveying rollers 92, ducts 94, 96 are placed so that they sandwich the conveying path of the thermal positive printing plate 12. The ducts 94, 96 are placed so that the longitudinal direction lies along the width direction of the thermal positive printing plate 12, and a slit 98 is provided in the surface thereof facing the conveying path of the thermal positive printing plate 12.

When dried air generated by a dry air generating means not shown is fed from one end side of the longitudinal direction of the ducts 94, 96, the ducts 94, 96 discharge this dried air from the slit toward the conveying path of the thermal positive printing plate 12, and blow the air to the thermal positive printing plate 12. Thus, gum liquid applied on the upper and lower surfaces is dried and a protective film is formed on the thermal positive printing plate 12.

In the development zone 14, a shielding lid 100 is placed so that the lower surface thereof is lower than the liquid surface of a developer stored in the development bath 24, to narrow the area of the liquid surface of a developer in the development bath 24 contacting with air. The sub-insertion port 40 (insertion port for re-entry) of the cover 36 is blocked by a shielding member not shown, and this shielding member prevents entry of outer air into the development zone 14.

In this shielding lid 100, a concave portion 100A into which the brush roller 142 projecting from the liquid surface of a developer and the conveying roller 60 enter, and a concave portion 100B into which the upper roller of the pair of the conveying rollers 52 and a selected part explained later enter, are formed. Thus, the liquid surface lid 100 can be used as it is, when the automatic developing apparatus 10 is used as any of automatic developing machines 10, 10B and 10C described later.

In the automatic developing apparatus 10, placing the liquid surface lid 100 in the development bath 24 prevents deterioration of a developer in the development bath 24 due to contact with a carbon dioxide gas in air, and evaporation of water. A shielding member (not shown) in the form of blade formed by silicone rubber and the like may be provided between the shielding lid 100, and treatment tank 22, the conveying roller 48, pair of the conveying rollersr 52 and the like to prevent contact of a developer in the development bath 24 with fresh outer air and to prevent evaporation of water in a developer. This is more preferable.

In the development bath 24 of the automatic developing apparatus 10, a conveying roller 48A is placed below the conveying roller 48 so that it faces the conveying roller 48. Thus, the thermal positive printing plate 12 is inserted into a nip between the conveying rollers 48, 48A by the pair of the conveying rollers 42 in the insertion portion 34. The conveying roller 48A rotates by rotation of the conveying roller 48, and the conveying rollers 48A, 48 sandwich the thermal positive printing plate 12 inserted in the nip therebetween and pull the thermal positive printing plate 12 into the development bath 24.

Further, in the development bath 24, a guide plate 44 is placed between the conveying roller 48 and the pair of the conveying rollers 50. This guide plate 44 guides the thermal positive printing plate 12 pulled in by the conveying rollers 48, 48A so that it is inserted at a predetermined angle into the nip between the pair of the conveying rollers 50.

A guide plate 46 is placed between the pairs of the conveying rollers 50, 52. This guide plate 48 guides the thermal positive printing plate 12 transported by the pair of the conveying rollers 50, toward the pair of the conveying rollers 52 along the bottom surface of the development bath 24.

This guide plate 46 faces the brush roller 142 and the conveying roller 60. The brush roller 142 and the guide plate 46 sandwich therebetween the thermal positive printing plate 12 conveyed on the upper surface of the guide plate 46 at a predetermined brush pressure. By rotation of the brush roller 142 in this state, the surface of the thermal positive printing plate 12 is brushed by the brush roller 142 and immersed in a developer to promote removal of a photosensitive layer. The conveying roller 60 prevents the thermal positive printing plate 12 conveyed on the guide plate 46 while being brushed by the brush roller 142 from being lifted from the guide plate 46, and therefore the thermal positive printing plate 12 is surely guided on the guide plate 46 toward the pair of the conveying rollers 52.

In this automatic developing apparatus 10, the brush roller 142 is used, referring to FIG. 3, the detailed constitution of these brush roller 142 is described below.

Figure 3:
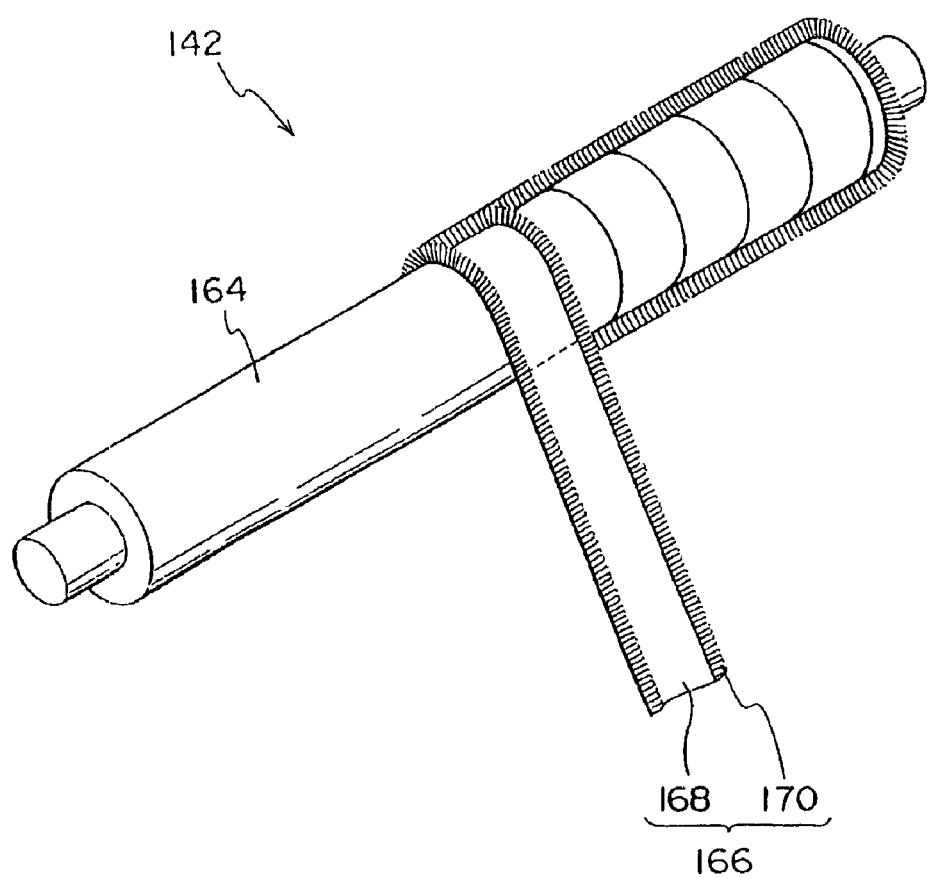
FIG. 3 is a perspective view of a brush roller closely wound with a band.

As shown in FIG. 3, the brush roller 142 comprises a roller 164 as a core material, and a band 166 for brushing (hereinafter, referred to simply as band 166) in the form of narrow band wound around the outer peripheral surface of this roller 164.

Figure 4:
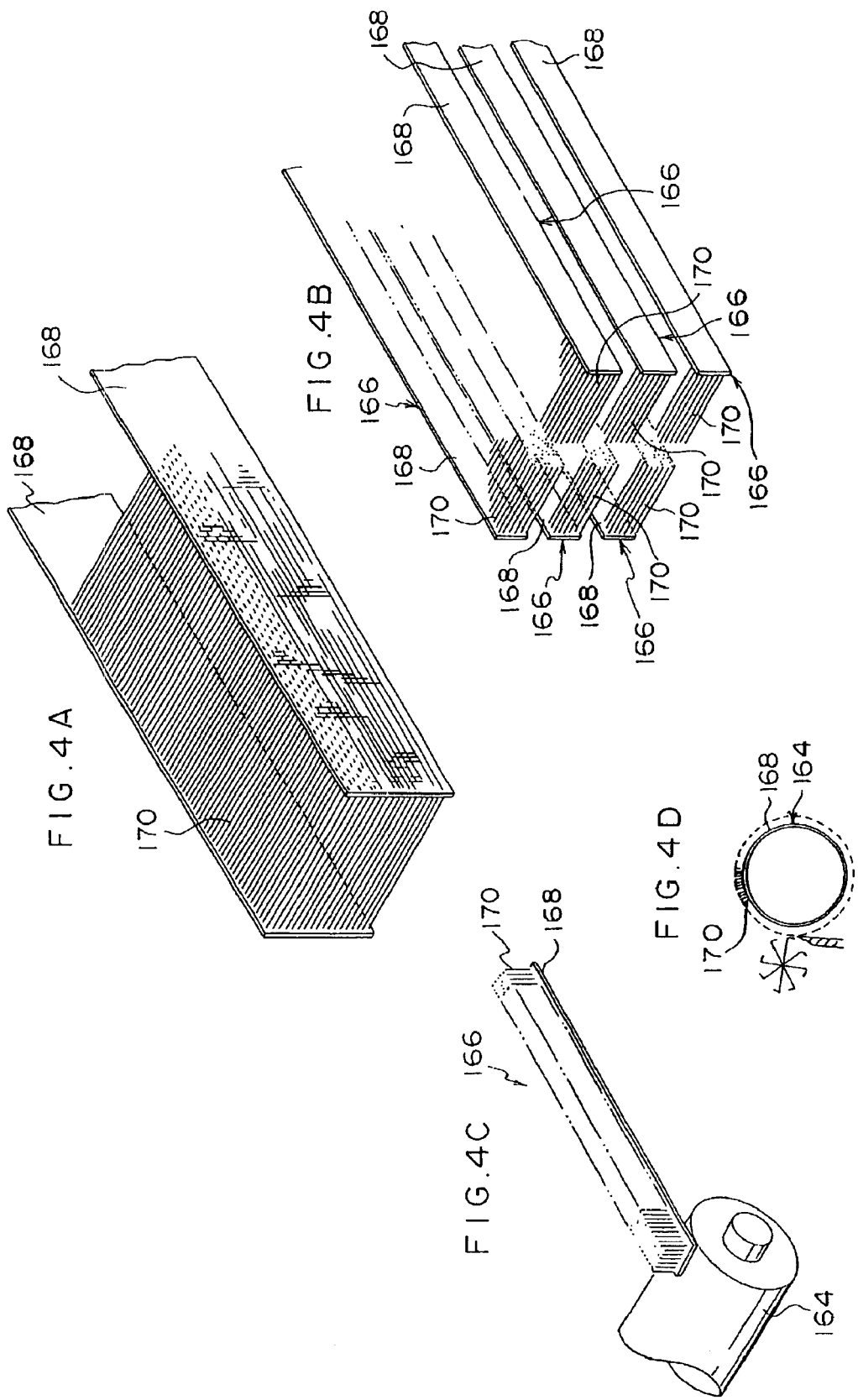
FIGS. 4A to 4D are flow charts showing a production process of a band applied in this embodiment.

In the case of this band 166, fabrics 168 as a substrate in the form of sheet are held so that they face each other and hairy material 170 is woven so as to bond them, as shown in FIG. 4A. As the hairy material 170, piles as natural fiber or artificial fiber are used in this embodiment. The hairy material 170 may also be a metal providing it has suitable thinness. The fabric 168 may also be a natural fiber, artificial fiber or thin metal.

The materials of the hairy material 170 are classified and listed below.

(1) Natural Fiber

Vegetable fiber, animal fiber (2) Artificial Fiber

Polyamide such as nylon 6, nylon 66, nylon 6'10, nylon 11 and the like

Polyesters such as polyethylene terephthalate, polybutylene terephthalate and the like Polyacryls such as polyacrylonitrile, polyalkyl acrylate and the like Polypropylene Polystyrene and the like (3) Metal Fiber Stainless steel Brass The hairy material 170 is woven tightly into the fabric 168 and then cut at the intermediate portion thereof to complete the band 166 (see FIG. 4B) used in this embodiment. The band 166 is wound helically around the outer peripheral surface of the roller 164 (see FIG. 4C) and then subjected to shirring so as to make the length uniform (see FIG. 4D) to complete a brush roller.

The specifications of this band 166 are as shown in Table 1.

TABLE 1

| Material of hairy material | Natural fiber/ Artificial fiber |
|---|---|
| Breadth of hairy material | 1 to 10000 D |
| Specifications in the case of thermal positive printing plate are shown in [ ] | [10 ≦ D ≦ 200] |
| Length of hairy material | 1 to 35 mm |
| Density of hairy material | 1000 to 200000 D/cm$^2$ |
| Specifications in the case of thermal positive printing plate are shown in [ ] | [40000 to 20000 D/cm$^2$] |
| Specifications of relation of length and breadth of hairy material | 1 ≦ L ≦ 7.5 × (log D + (2/3)) |
| Specifications in the case of thermal positive printing plate are shown in [ ] | [4 × (log D + (7/8) ≦ L ≦ 7.5 × (log D + (2/5)] |

| Material of hairy material | Metal fiber |
|---|---|
| Breadth of hairy material | 10 to 200 R |
| Length of hairy material | 1 to 35 mm |
| Density of hairy material | 0.05 to 7.0 mm$^2$/cm$^2$ |
| Specifications in the case of thermal positive printing plate are shown in [ ] | [1.0 to 5.0 mm$^2$/cm$^2$] |
| Specifications of relation of length and breadth of hairy material | 1 ≦ L ≦ 0.1 R + 10 |

L: length of hairy material (mm),
D: breadth of hairy material (denier/hair),
log: common logarithm
R: hair diameter of hairy material (μm)

When the band 166 is wound helically around the outer peripheral surface of the roller 164 as described above, it can be wound tightly (close winding shown in FIG. 3).

Thus, the hairy material 170 is uniformly transplanted into the whole surface of the outer peripheral surface of the roller 164 in a predetermined density.

Figure 5:
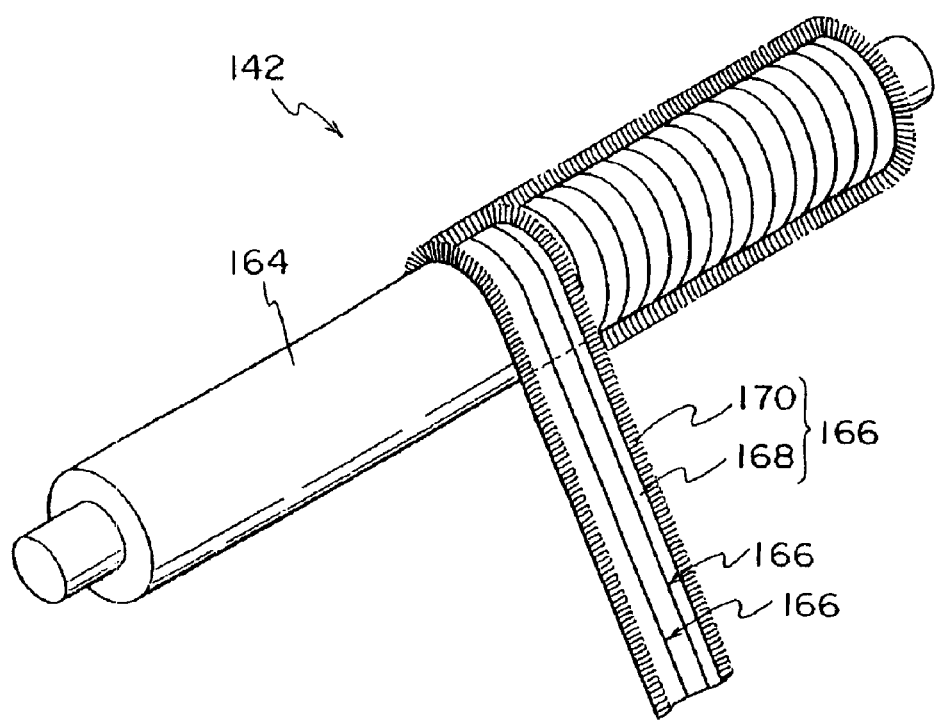
FIG. 5 is a perspective view of a brush roller wound with three bands.
Figure 6:
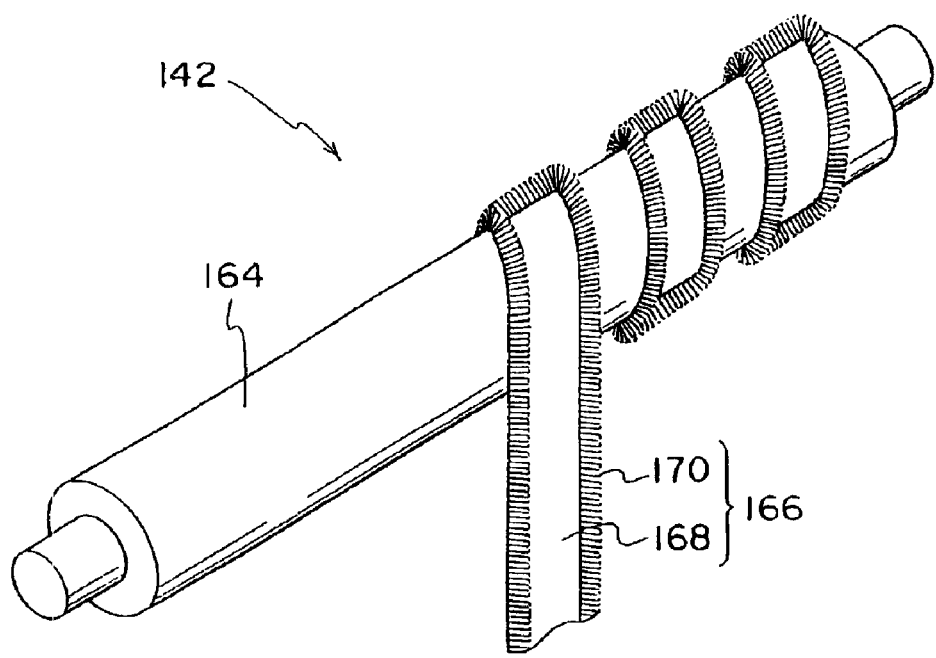
FIG. 6 is a perspective view of a brush roller wound with a band with a certain pitch.

Examples of the winding method of the band 166 around the roller 164 include a method in which three bands 166 are tighly wound, with the three bands 166 arranged in parallel (winding three bands) as shown in FIG. 5, and a method in which one band 166 is wound at a predetermined pitch (pitch winding) as shown in FIG. 6. After this, the hairy material 170 is further cut so as to make the length of the hairy material uniform as described above to complete brush roller 142.

FIG. 8 shows a graph revealing condition capable of improving unevenness of brushing of a photosensitive planographic printing plate when the hairy material is made of natural fiber or artificial fiber. Namely, the following matters can be read from this graph in FIG. 8.

When a photosensitive planographic printing plate is brushed, the length (L) of a hairy material is preferably 1≦L≦7.5×(log D+(2/3)).

When a thermal printing plate which is one of photosensitive planographic printing plates is brushed, the hairy material meets the following conditions: 4×(log D+(7/8))≦length of hairy material (L)≦7.5×(log D+(2/5) and 10≦breadth of hairy material (D)≦200.

The action of this embodiment is described below.

In this automatic developing apparatus 10, when the thermal positive printing plate 12 on which images have been recorded by exposure by an image exposure apparatus (not shown) such as a printing apparatus and the like is inserted through the insertion port 32, the conveying roller 42 is rotated. Thus, the thermal positive printing plate 12 is sandwiched by the pair of the conveying rollers 42, and pulled into the automatic developing apparatus 10.

In the automatic developing apparatus 10, a sensor for detecting the thermal positive printing plate 12 passing the insertion port 32 is provided near the insertion port 32. When the sensor detects insertion of the thermal positive printing plate 12, the pair of the conveying rollers 42 and the like starts to rotate, and at a timing based on the detection of the thermal positive printing plate 12 by this sensor, rinsing water is discharged from the spray pipes 66, 68 in the rinsing zone 16 and gum liquid is discharged from the spray pipes 72, 74 in the de-sensitizing treatment zone 18.

The pair of the conveying rollers 42 transports the thermal positive printing plate 12 pulled through the insertion port 32 at an insertion angle of 15° to 31° to the horizontal direction into the developing bath 24. Thus, the thermal positive printing plate 12 is conveyed in the developing bath 24 by the conveying rollers 48, 48A and the pairs of the conveying rollers 50, 52 while being guided by the guide plates 44, 46, and immersed in a developer stored in the developing bath 24, and conveyed out of the developer at a discharge angle within the range from 17° to 31°.

By immersing the thermal positive printing plate 12 into a developer in the development bath 24, unnecessary portions of the photosensitive layer are removed from the support depending on exposed images. In this procedure, in the automatic developing apparatus 10, removal of unnecessary portions of the photosensitive-layer from the surface of the thermal positive printing plate 12 is promoted by brushing the surface of the thermal positive printing plate 12 (surface of photosensitive layer side) by the brush roller 142 placed in the development bath 24.

The thermal positive printing plate 12 conveyed out of the development bath 24 after development is transported to the rinsing zone 16 by the pair of the conveying rollers 52. In this operation, the pair of the conveying rollers 52 squeeze off a developer adhered to the upper and lower surfaces of the thermal positive printing plate 12.

In the rinsing zone 16, rinsing water is ejected from the spray pipes 66, 68 while this thermal positive printing plate 12 is sandwiched by the pairs of the conveying rollers 62, 64 and conveyed approximately horizontally. The pair of the conveying rollers 64 placed at the downstream side of the conveying direction of the thermal positive printing plate 12 transports this thermal positive printing plate 12 to the de-sensitizing treatment zone 18 while the rinsing water fed to the upper and lower surfaces of the thermal positive printing plate 12 is squeezed off together with a developer which has not been squeezed off by the pair of the conveying rollers 52 and which remains on the plate 12.

Thus, a developer remaining on the upper and lower surfaces of the thermal positive printing plate 12 is washed off when the plate 12 passes through the rinsing zone 16.

The thermal positive printing plate 12 transported to the de-sensitizing treatment zone 18 passes through a space between the spray pipes 72, 74 and is sandwiched by the pair of the conveying rollers 70, and conveyed out of the de-sensitizing treatment zone 18 by this pair of the conveying rollers 70.

In this operation, in the de-sensitizing treatment zone 18, gum liquid is discharged from the spray pipes 66, 68, applied to the upper and lower surfaces of the thermal positive printing plate 12 and spreads uniformly over the whole surfaces. The pair of the conveying rollers 70 sandwiches and conveyes the thermal positive printing plate 12 and squeezes off excess gum liquid from the upper and lower surfaces of the thermal positive printing plate 12, and thus, a uniform thin film of gum liquid is formed on the upper and lower surfaces of the thermal positive printing plate 12.

The thermal positive printing plate 12 on which gum liquid has been applied is transported from the insertion port 84 to the drying zone 20 by the pair of the conveying rollers 70. When a shutter is provided at the insertion port 84, the shutter is operated to open the insertion port 84 at the time procesing of the thermal positive printing plate 12 is initiated or the time the thermal positive printing plate 12 is conveyed from the de-sensitizing treatment zone 18, and unnecessary of drying wind in the drying zone 20, when the thermal positive printing plate 12 is not passing, into the de-sensitizing treatment zone 18, which entering causes fixing of gum liquid on the pair of the conveying rollers 70 is prevented, air is prevented from entering via the insertion port 84, reaching to the development zone 14, and deterioration of a developer by a carbon dioxide gas in air is prevented, and evaporation of water in the developer, rinshing water, and water in gum liquid, and leak of the water via the insertion port 84 is prevented.

In the drying zone 20, dry wind is blown to the upper and lower surfaces of this thermal positive printing plate 12 from the ducts 94, 96 while the thermal positive printing plate 12 is conveyed by the supporting roller 86 and the pairs of the conveying rollers 90, 92. Thus, a protective film made of gum liquid is formed on the thermal positive printing plate 12 and the thermal positive printing plate 12 is discharged from the discharge port 88.

In this embodiment, the brush roller 142 used in the development zone 24 has a different structure from those of conventional channel brush rollers or molten rollers.

Namely, the band 166 is wound around the outer peripheral surface of the roller 164 which is a core material. This bond 166 is prepared by weaving the hairy material (pile hair) 170 into the sheet-like fabric 168.

By weaving the hairy material 170 into the fabric 168, the hairy material 170 can be woven at a uniform pitch of $\mu$m order, and incomplete removal of unnecessary portions of the recording layer due to unevenness of the density of hairy materials which occurs when a channel brushe is used can be solved.

Further, since the hairy material 170 can be provided at high density, the rigidity of the hairy material 170 can be enhanced, and even in the case of thermal positive printing plate which needs more severe pressure control to remove unnecessary portions of a recording layer which is a photosensitive layer than other photosensitive planographic printing plates, fine control is remarkably easy as compared with molten bruch rollers and the brush roller can exhibit reliably a brushing function.

The method of winding the band 166 around the roller 164 include close winding (see FIG. 3), winding three bands (see FIG. 5) and pitch winding (see FIG. 6).

In this embodiment, the brush rollers 126, 142 used in the pre-rinsing zone 120 and developing treatment zone 130 are prepared by winding around the outer peripheral surface of the roller 164 as a core material the narrow band 166 produced by weaving the hairy material 170 into the sheet-like fabric 168, therefore, the hairy material 170 can be placed tightly and uniformly over the outer peripheral surface of the roller, and fine control of brush pressure can be conducted easily, this embodiment is optimal to the thermal positive printing plate 12, and excess removal or incomplete removal of unnecessary portions of the recording layer 106 can be solved, and brushing unevenness is not caused.

When the above-mentioned thermal positive printing plate 12 is developed using an alkaline developer containing at least one saccharide selected from non-reducing sugars and at least one base after exposure by an infrared beam, development is promoted by brushing it in this developer with the brush roller 142 produced by winding around the outer peripheral surface of an axially rotating roller a brushing band composed of a sheet-like substrate into which a hairy material has been woven in the present embodiment. This brush roller 142 enables fine control of brush pressure, is suitable for the thermal positive printing plate 12 which requires sever brush pressure, and can brush the prnting plate with optimal brush pressure. Therefore, scratch of the plate surface by brushing can be prevented. Precipitate which leads to scratch of the plate surface due to adhesion thereof to the brush roller can be suppressed by use of a developer containing a non-reducing sugar.

In order to evaluate brushing by the above-mentioned brush roller, scratch on image portions (exposed portions) was checked by visually observing the resulted thermal positive printing plate 12 every day, and no scratch was found. Further, neither excess development nor incomplete development was found, and it was possible for the thermal positive printing plate 12 to be processed stably for one month. Further, these thermal positive printing plates 12 were printed with commercially available Chinese ink using a printed LISRON manufactured by Komori Corporation and constant printing resistance could be kept (100000 pieces) without blur. Next, this developer that had been used for 1 month was observed, and no precipitates having the potential to scratch a roller or the like was found.

Further, the invention is not limited to a treatment method in which a photosensitive planographic printing plate is immersed in a developer in a storage bath in a developing zone, and can also be applied to a method in which a developer is discharged by a discharging means onto a photosensitive planographic printing plate conveyed horizontally in a developing zone.

(Examples of Developer)

As the developer used for development treatment, that obtained by adding 0.01 g of the following compound A to 1 liter of an aqueous solution containing 5.0% of a potassium salt composed of D-sorbitol/potassium oxide $K_2O$ combining a non-reducing sugar with a base, 0.015% of Olfin AK-02 (manufactured by Nisshin Chemicals Co., Ltd.) and 0.010% of a surfactant Pionin D-1105 (manufactured by Takemoto Oil & Fat Co., Ltd.), is prepared in an amount corresponding to the volume of a development bath and used.

Pionine D-1105

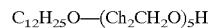

$$C_{12}H_{25}O\text{—}(Ch_2CH_2O)_5H$$

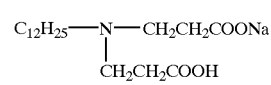

Compound A

The automatic developing apparatus 10A is so set that development is conducted at a liquid temperature of a developer of 30° C. and a development time of 12 seconds.

(Example of Thermal Positive Printing Plate 12)

As the thermal positive printing plate 12 (photosensitive material) which can be used in this embodiment, those described in JP-A No. 11-119419 suggested by the present applicant can be used. More specific explanations will be made below.

[Production of Substrate]

Aluminum (material 1050) having a thickness of 0.3 mm was degreased by washing it with trichloroethylene, and thereafter the surface thereof was sand-grained using a nylon brush and pumice-water suspension, and washed thoroughly with water. The plate was etched by immersing it into a 25% sodium hydroxide aqueous solution at 45° C. for 9 seconds, and washed with water, immersed in 20% nitric acid for 20 seconds, and washed with water. The etching amount of the sand-grained surface was about 3 $g/m^2$ at this stage. Next, a direct current anodized film of 3 $g/m^2$ was provided on this plate at a current density of 15 A/dm² using 7% nitric acid as an electrolyte, the plate was washed with water, dried, an undercoat solution was applied thereto, and the applied film was dried at 90° C. for 1 minute. The application amount of the film after drying was 10 mg/m².

| | |
|---|---|
| β-alanine | 0.5 g |
| Methanol | 95 g |
| Water | 5 g |

[Photosensitive Liquid]

The following photosensitive liquid was applied to the resulted support so that the application amount was 1.8 g/m², to obtain a planographic printing plate.

Photosensitive Liquid

| | |
|---|---|
| m,p-cresol novolak (m/p ratio = 6/4, weight-average molecular weight: 3500, containing 0.5 wt % unreacted cresol) [component (A)] | 1.0 g |
| Cyanine dye A [component (B + C)] | 0.2 g |
| Tetrahydrophthalic anhydride [component (D)] | 0.05 g |
| Dye obtained by substituting 1-naphthalenesulfonate anion for counter anion in Victoria Pure Blue BOH | 0.02 g |
| Fluorine-containing surfactant (Megafack F177, manufactured by Dainippon Ink & Chemicals, Inc.) | 0.05 g |
| γ-butyrolactone | 3 g |
| Methyl ethyl ketone | 8 g |
| 1-methoxy-2-propanol | 7 g |

[Plate Making Method]

The resulted planographic printing plate was exposed to light using semiconductor laser of an output of 500 mW, a wavelength of 830 nm and a beam diameter of 17 μm (1/e²), at a main scanning speed of 5 m/second, and developed with the developer explained above.

What is claimed is:

1. A method of developing a photosensitive planographic printing plate which has been exposed to an infrared light beam with an alkaline developer containing at least one saccharide selected from non-reducing sugars and at least one base, the photosensitive planographic printing plate including a support having a surface which has been subjected to hydrophilic treatment having disposed thereon a recording layer formed by applying to the support a positive photosensitive composition for an infrared laser, the positive photosensitive composition including:

(A) at least one alkali aqueous solution-soluble polymer compound having at least one functional group selected from (a-1) a phenolic hydroxyl group, (a-2) a sulfoneamide group, and (a-3) an active imide group; either (B) a compound that lowers the solubility of the at least one alkali aqueous solution-soluble polymer compound because of its compatibility with the alkali aqueous solution-soluble polymer compound in an alkali aqueous solution, with the solubility-decreasing action being reduced by heat; and (C) a compound that generates heat by absorbing light, provided that (B) and (C) are different; or (BC) a compound that (i) lowers the solubility of the at least one alkali aqueous solution-soluble polymer compound because of its compatibility with the alkali aqueous solution-soluble polymer compound in an alkali aqueous solution, with the solubility-decreasing action being reduced by heat, and (ii) generates heat by absorbing light; and (D) a cyclic acid anhydride, wherein the photosensitive planographic printing plate is immersed in the developer while being conveyed, and development is accelerated by brushing the immersed photosensitive planographic printing plate with a brush member produced by winding, around a peripheral surface of an axially rotating roller, a brushing band composed of a sheet-like substrate containing a hairy material woven therein; and wherein the alkaline developer further contains at least one compound selected from the group consisting of compounds represented by formula (IA) or formula (IIA) and salts thereof:

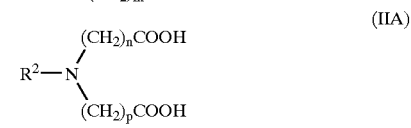

wherein $R^1$ and $R^2$ each represent a hydrocarbon group having 4 to 30 carbon atoms, and m, n and p each represent an integer of 1 to 10.

2. The method of claim 1, wherein the substrate is fabric.

3. The method of claim 1, wherein the hairy material is natural fiber or artificial fiber, a breadth D of the hairy material is 1 to 10,000 denier/hair, a length of the hairy material is 1 to 35 mm, and a density P of the hairy material formed as a brushing band is 1,000 to 200,000 denier/cm², wherein p=D×number of hairy material per unit area (number/cm²).

4. The method of claim 2, wherein the hairy material is natural fiber or artificial fiber, a breadth D of the hairy material is 1 to 10,000 denier/hair, a length of the hairy material is 1 to 35 mm, and a density P of the hairy material formed as a brushing band is 1,000 to 200,000 denier/cm², wherein P=D×number of hairy material per unit area (number/cm²).

5. The method of claim 3, wherein the relation of the breadth of the hairy material (denier/hair) to the length L (mm) of the hairy material is such that $1 \leq L \leq 7.5 \times (\log D + (2/3))$.

6. The method of claim 4, wherein the relation of the breadth of the hairy material (denier/hair) to the length L (mm) of the hairy material is such that $1 \leq L \leq 7.5 \times (\log D + (2/3))$.

7. The method of claim 1, wherein the material of the hairy material is metal fiber, a hair diameter R of the hairy material is from 10 to 200 μm/hair, a length of the hairy material is 1 to 30 mm, and a density P of the hairy material formed as a brushing band is from 0.05 to 7.0 mm²/cm², wherein P=sectional area per one hairy material (mm²/hair)× number of hairy material per unit area (number/cm²).

8. The method of claim 2, wherein the material of the hairy material is metal fiber, a hair diameter R of the hairy material is from 10 to 200 μm/hair, a length of the hairy material is 1 to 30 mm, and a density P of the hairy material formed as a brushing band is from 0.05 to 7.0 mm²/cm², wherein P=sectional area per one hairy material (mm²/hair)× number of hairy material per unit area (number/cm²).

9. The method of claim 7, wherein the relation of the hair diameter R of the hairy material (μm/hair) to the length L (mm) of the hairy material is such that $1 \leq L \leq 0.1R + 10$.

10. The method of claim 8, wherein the relation of the hair diameter R of the hairy material (μm/hair) to the length L (mm) of the hairy material is such that $1 \leq L \leq 0.1R + 10$.

* * * * *